United States Patent
Sakaguchi

(10) Patent No.: US 9,466,584 B2
(45) Date of Patent: Oct. 11, 2016

(54) METHOD FOR MANUFACTURING SEMICONDUCTOR DEVICE

(71) Applicant: FUJI ELECTRIC CO., LTD., Kawasaki-shi (JP)

(72) Inventor: Shoji Sakaguchi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/990,355

(22) Filed: Jan. 7, 2016

(65) Prior Publication Data
US 2016/0240504 A1    Aug. 18, 2016

(30) Foreign Application Priority Data
Feb. 17, 2015 (JP) ................ 2015-029025

(51) Int. Cl.
*H01L 23/00* (2006.01)
*H01L 29/66* (2006.01)

(52) U.S. Cl.
CPC ............... *H01L 24/27* (2013.01); *H01L 24/33* (2013.01); *H01L 29/66333* (2013.01); *H01L 2224/2783* (2013.01); *H01L 2224/27464* (2013.01); *H01L 2224/29644* (2013.01); *H01L 2224/29655* (2013.01); *H01L 2924/13055* (2013.01)

(58) Field of Classification Search
CPC .......... H01L 2224/73265; H01L 2224/48227; H01L 2224/32225; H01L 2224/32145
See application file for complete search history.

(56) References Cited

U.S. PATENT DOCUMENTS

| | | |
|---|---|---|
| 2004/0256730 A1 | 12/2004 | Hirano et al. |
| 2005/0170612 A1 | 8/2005 | Miyanari et al. |
| 2014/0120716 A1* | 5/2014 | Sakaguchi ........ H01L 29/66333 438/652 |

FOREIGN PATENT DOCUMENTS

| | | |
|---|---|---|
| JP | 2005-19798 A | 1/2005 |
| JP | 2005-191550 A | 7/2005 |
| JP | 2011-22541 A | 11/2011 |
| JP | 2011-219503 A | 11/2011 |
| JP | 2011-222541 A | 11/2011 |
| JP | 2014-086667 A | 5/2014 |

* cited by examiner

*Primary Examiner* — Tony Tran
(74) *Attorney, Agent, or Firm* — Manabu Kanesaka

(57) ABSTRACT

A method for manufacturing a semiconductor device includes a first step of forming a first electrode on one main surface side of a semiconductor wafer; a second step of bonding a first film to another main surface side of the semiconductor wafer; a third step of bonding a second film to an outer peripheral portion of the semiconductor wafer by applying pressure to the second film on the semiconductor wafer using a plurality of cylindrical rollers, after the second step; and a fourth step of forming a plating layer on the first electrode on the one main surface side of the semiconductor wafer by a plating process, after the third step.

14 Claims, 15 Drawing Sheets

FIG. 13

| SHORE HARDNESS | STATE AFTER PLATING PROCESS | DURABILITY |
|---|---|---|
| 20 | ○ | × |
| 30 | ○ | ○ |
| 40 | ○ | ○ |
| 60 | ○ | ○ |
| 80 | ○ | ○ |
| 90 | ○ | ○ |
| 95 | △ | ○ |

FIG. 14

| PRESSURE (kPa) | STATE AFTER PLATING PROCESS | DURABILITY |
|---|---|---|
| 10 | × | ○ |
| 20 | △ | ○ |
| 50 | ○ | ○ |
| 100 | ○ | ○ |
| 150 | ○ | ○ |
| 200 | ○ | ○ |
| 250 | ○ | ○ |
| 300 | ○ | × |

FIG. 15

| V GROOVE ANGLE (DEGREES) | STATE AFTER PLATING PROCESS | DURABILITY |
|---|---|---|
| 20 | ○ | △ |
| 30 | ○ | ○ |
| 60 | ○ | ○ |
| 90 | ○ | ○ |
| 120 | ○ | ○ |
| 160 | ○ | ○ |
| 170 | × | × |
| NO GROOVE | × | × |

FIG. 16

| SANDWICHING PRESSURE (kPa) | STATE IMMEDIATELY AFTER BONDING |
|---|---|
| 10 | × |
| 20 | ○ |
| 80 | ○ |
| 100 | ○ |
| 150 | ○ |
| 200 | △ |
| 300 | × |
| 400 | × |

FIG. 17

| SANDWICHING PRESSURE (kPa) | | STATE IMMEDIATELY AFTER BONDING |
|---|---|---|
| FIRST STAGE | SECOND STAGE | |
| 20 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 50 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 80 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 100 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 150 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 200 | 20 | ○ |
| | 50 | ○ |
| | 80 | ○ |
| | 100 | ○ |
| | 150 | ○ |
| | 200 | ○ |
| | 300 | ○ |
| | 400 | ○ |
| 300 | 20 | × |
| | 50 | × |
| | 80 | × |
| | 100 | × |
| | 150 | × |
| | 200 | × |
| | 300 | × |
| | 400 | × |
| 400 | 20 | × |
| | 50 | × |
| | 80 | × |
| | 100 | × |
| | 150 | × |
| | 200 | × |
| | 300 | × |
| | 400 | × |

METHOD FOR MANUFACTURING SEMICONDUCTOR DEVICE

CROSS REFERENCE TO RELATED APPLICATION

The application claims priority of Japanese Patent Application No. 2015-029025 filed on Feb. 17, 2015, the disclosure of which is incorporated herein.

BACKGROUND OF THE INVENTION

1. Field of the Invention

This invention relates to a method for manufacturing a semiconductor device.

2. Description of the Related Art

In general, power semiconductor elements which are used in a power conversion device, or the like, include semiconductor elements which perform a switching operation, such as a metal oxide semiconductor field effect transistor (MOS-FET) or an insulated gate bipolar transistor (IGBT), or a free wheel diode (FWD), which is used in combination with these semiconductor elements, etc.

For example, an IGBT has the high-speed switching characteristics and voltage drive characteristics of a MOS-FET, and the low on-voltage characteristics of a bipolar transistor, and structures such as punch through (PT), non-punch through (NPT), and field stop (FS), etc. are commonly known. In the case of an NPT-type IGBT or an FS-type IGBT, a method of manufacture using an inexpensive semiconductor substrate (called the "FZ substrate" below) based on a floating zone (FZ) method is known.

By using an FZ substrate, it is possible to significantly reduce the product thickness (the overall thickness of the semiconductor substrate) and to increase the heat dispersion properties, compared to a case of using a semiconductor substrate in which a plurality of epitaxial layers is stacked on top of a starting substrate (called the "epitaxial substrate" below). For example, in the case of an FS-type IGBT, the overall thickness of the semiconductor substrate is approximately 50 µm to 200 µm. Each electrode in a semiconductor element (chip) of this kind is connected to a circuit pattern and/or a plate-shaped conductor (collectively called "external connection terminals" below) on an insulating substrate on which the element is mounted, and is wired to the outside.

For example, a method has been proposed in which, in a vertical-type semiconductor element having an electrode (electrode pad) on both main surfaces, mutually different external connection terminals (for example, copper foil sheets) are bonded by solder bonding to both a front surface electrode and a rear surface electrode. By solder bonding the front surface electrode and the external connection terminal, it is possible to achieve higher density mounting of module packages, improved current density, reduced wiring capacitance in order to raise the switching speed, and improved cooling efficiency of the semiconductor elements, and so on.

The front surface electrode is normally formed by using a metal having poor solder wetting properties, of which the main component is aluminum (Al), for example. Consequently, a method has been proposed in which the solder wetting properties of the surface of the front surface electrode are improved and the bonding reliability at the interface between the front surface electrode and the solder layer is improved, by forming a metal layer having good solder wetting properties (for example, a nickel (Ni) layer), on the surface of the front surface electrode (for example, see PTL 1 (paragraph 0033) indicated below). Plating methods using electroplating or electroless plating are known generally as methods for forming a metal layer having good solder wettability on the surface of the front surface electrode in this way.

Moreover, a method to carry out a plating process selectively only in a prescribed portion, in a state where a portion where a plating layer is not to be formed is covered with an insulating film and/or resin film, a resist film, a supporting substrate, and the like, or a state where a semiconductor substrate is fixed by a special jig which prevents plating liquid from flowing around into portions where the plating layer is not to be formed, is known. For example, a method has been proposed, in which a prescribed process is carried out on a surface to be processed in a state where a support plate (support substrate) has been bonded via an adhesive layer to the surface of a semiconductor substrate on the opposite side to the surface to be processed (for example, see PTL 2 indicated below).

Moreover, a further method has been proposed, in which, when forming a plating layer on only the surface of one main surface-side electrode (front surface electrode) of a semiconductor substrate, a plating process is carried out in a state where a first film has been bonded to the surface of the other main surface-side electrode (rear surface electrode), and a second film has been bonded to the outer peripheral portion of the semiconductor substrate (for example, see PTL 3 indicated below). In PTL 3, by protecting the rear surface electrode and the outer peripheral portion of the substrate with a film, it is possible to prevent abnormal precipitation of the plating layer onto the rear surface electrode and the outer peripheral portion of the substrate, as well as soiling of the plating bath and/or change over time in the composition of the plating bath due to the separation of an abnormally precipitated plating layer, and so on.

CITATION LIST

Patent Literature

PTL 1: JP-A-2005-019798
PTL 2: JP-A-2005-191550
PTL 3: JP-A-2014-086667

SUMMARY OF THE INVENTION

However, as a result of thorough research by the inventors, and others, it was determined that the following problems occur with conventional plating process methods. When the thickness of a semiconductor substrate is reduced to approximately 30 µm to 200 µm, for instance, warping occurs in the semiconductor substrate due to the processing steps before the plating process. Consequently, there is a risk of cracks and/or fractures in the semiconductor substrate, with the method in which the semiconductor substrate is fixed by a special jig that prevents the plating solution from flowing around into the portions where a plating layer is not to be formed. Therefore, it is difficult to automate the task of fixing the semiconductor substrate into the special jig, and this work is performed manually by an operator; hence, there is a problem in that the work takes time and labour input, and mass production is not possible.

Furthermore, when a plating process is carried out on the front surface electrode in a state where the rear surface side, for instance, of the semiconductor substrate has been covered with a resist film, then the adhesion between the resist film and the metal layer (rear surface electrode) formed on the rear surface side of the semiconductor substrate before formation of the resist film, is low. Therefore, in an electroless plating processing at a temperature of around 80° C. for forming a plating layer on the front surface of the semiconductor substrate, the resist film separates from the rear surface electrode. Moreover, there is a risk of soiling of the plating bath due to components such as the organic solvent in the resist film, and the like, dissolving into the plating solution during the electroless plating process.

When the plating bath becomes soiled by organic solvent, or the like, then there are problems, such as adhesion defects between the plating layer and the metal layer, partial protrusion of the plating layer surface (bulging of the plating layer), absence of precipitation of the plating layer, slowing of the precipitation rate, abnormal gloss and/or emulsification of the plating layer surface, abnormal precipitation of the plating layer, and the like. Therefore, it is necessary to replace the plating bath and to clean the plating tank. Furthermore, since the resist film is expensive, there is a problem in that the manufacturing costs of the semiconductor element are high.

Moreover, if the semiconductor substrate is thin, at 200 μm or lower, then there is a problem in that the semiconductor substrate warps due to the stress that occurs when a resist film is formed by curing the resist that has been applied so as to cover the portion where the plating layer is not to be formed, and automatic conveyance of the semiconductor substrate becomes difficult. These problems are not limited to cases of forming a nickel layer by an electroless plating process (electroless nickel plating process), and also occur similarly in the case of forming another metal layer, such as a gold plating layer, by an electroless plating process.

In PTL 2, a plurality of small through holes, which forms inlet ports for alcohol in order to dissolve the adhesive layer between the support plate and the semiconductor substrate when the support plate is to be separated from the semiconductor substrate, is formed over substantially the entire surface of the support plate. Therefore, when an electroless plating process has been carried out using PTL 2 indicated above, chemical solutions, such as the nitric acid (strong acid) and the sodium hydroxide solution (strong alkali) used in the electroless plating process, pass via the through holes in the support plate and reach the adhesive layer. The adhesive layer is dissolved by these chemical solutions, the adhesive strength of the adhesive layer is lost; therefore, the support plate separates from the semiconductor substrate during the electroless plating process. Furthermore, the plating bath becomes soiled by the adhesive layer which has dissolved in the course of the electroless plating process.

In PTL 3, by bonding the film to the semiconductor substrate while applying a strong pressure, the plating liquid is not liable to enter the film. Therefore, the film is not liable to separate from the semiconductor substrate during the plating process, and abnormal precipitation of the plating layer in the portion where the plating layer is not to be formed, which is covered by the film, is suppressed. However, even after the plating process, the force of adhesion of the film remains high, and therefore separation of the film is difficult to achieve and there is a risk of the adhesive component of the film remaining on the surface of the semiconductor substrate. If the adhesive component of the film is left on the surface of the semiconductor substrate, then in the subsequent steps, there is a risk of the semiconductor substrate bonding to the conveyance means during conveyance of the semiconductor substrate, and cracks occurring in the semiconductor substrate when the semiconductor substrate is separated from the conveyance means.

Therefore, automation of the manufacturing process is difficult to achieve. On the other hand, when the film is bonded to the semiconductor substrate while being pressed with a weak pressure, the plating liquid is liable to enter into and soil the film, the adhesive strength of the film declines during the plating process, and the film separates from the semiconductor substrate. Therefore, a problem arises in that it is not possible to prevent abnormal precipitation of the plating layer in the portion where the plating layer is not to be formed.

In order to solve the abovementioned problems of the conventional art, it is an object of this invention to provide a method for manufacturing a semiconductor device whereby abnormal precipitation of a plating layer in portions where a plating layer is not to be formed can be prevented. Furthermore, in order to solve the abovementioned problems of the conventional art, a further object of this invention is to provide a method for manufacturing a semiconductor device whereby bonding of a protective film to a portion where a plating layer is not to be formed and separation of the protective film can be carried out stably when performing a plating process in a prescribed portion.

In order to eliminate the abovementioned problems and achieve the objects of the present invention, the method for manufacturing a semiconductor device according to this invention is a method for manufacturing a semiconductor device in which a plating layer is formed by a plating process on one main surface side of a semiconductor wafer, the method having the following characteristic features. Firstly, a first step of forming a first electrode on one main surface side of the semiconductor wafer is carried out. Thereupon, a second step of bonding a first film to another main surface side of the semiconductor wafer is carried out. After the second step, a third step of bonding a second film to an outer peripheral portion of the semiconductor wafer is carried out. After the third step, a fourth step of forming the plating layer on the first electrode on one main surface side of the semiconductor wafer by the plating process is carried out. In the third step, the second film is bonded to the semiconductor wafer by applying pressure to the second film on the semiconductor wafer using a plurality of cylindrical rollers.

Furthermore, in the method for manufacturing a semiconductor device according to this invention, the method uses, as the plurality of rollers, a first roller which contacts a side surface of the semiconductor wafer via the second film, and second rollers which contact one main surface and the other main surface of the semiconductor wafer, respectively via the second film.

Furthermore, in the method for manufacturing a semiconductor device according to this invention, in the third step, first and second bonding steps are carried out. In the first bonding step, the second film is pressed and bonded to the side surface of the semiconductor wafer by the first roller. In the second bonding step, an end portion of the second film in a state of having been bonded to the side surface of the semiconductor wafer is bonded to the main surface of the semiconductor wafer by sandwiching the end portion between the second rollers and the semiconductor wafer.

Furthermore, in the method for manufacturing a semiconductor device according to this invention, in the second bonding step, the end portion of the second film is sandwiched between the second rollers and the semiconductor wafer from a portion of the second film that is bonded to the side surface of the semiconductor wafer by the first roller.

Furthermore, in the method for manufacturing a semiconductor device according to this invention, in the third step, the second film is bonded over at least the entire outer periphery of the semiconductor wafer.

Furthermore, in the method for manufacturing a semiconductor device according to the present invention, in the third step, the second film is bonded in such a manner that an end portion of the second film on a bonding finish point side in a direction along the outer periphery of the semiconductor wafer overlaps with an end portion of the second film on a bonding start point side in the direction along the outer periphery of the semiconductor wafer.

Furthermore, in the method for manufacturing a semiconductor device according to the present invention, in the third step, the free end side of the end portion of the second film on the bonding finish point side in the direction along the outer periphery of the semiconductor wafer is caused to project outward beyond the side surface of the semiconductor wafer, and is left as a projecting section.

Furthermore, the method for manufacturing a semiconductor device according to the present invention further includes a fifth step of holding the projecting section of the second film to separate the second film, after the fourth step.

Furthermore, in the method for manufacturing a semiconductor device according to the present invention, the first roller is an elastic body and a Shore hardness of the first roller is no less than 30 and no more than 90.

Furthermore, in the method for manufacturing a semiconductor device according to the present invention, the pressure applied to the semiconductor wafer by the first roller when bonding the second film is no less than 50 kPa and no more than 250 kPa.

Furthermore, in the method for manufacturing a semiconductor device according to the present invention, the first roller has a V-shaped groove in a portion facing the side surface of the semiconductor wafer.

Furthermore, in the method for manufacturing a semiconductor device according to the present invention, an angle of the groove in the first roller is no less than 30 degrees and no more than 160 degrees.

Furthermore, in the method for manufacturing a semiconductor device according to the present invention, in the third step, the second film is bonded to the outer peripheral portion of the semiconductor wafer such that the second film spans from one main surface to the other main surface of the semiconductor wafer.

Furthermore, in the method for manufacturing a semiconductor device according to the present invention, in the third step, the second film is bonded to the outer peripheral portion of the semiconductor wafer such that the bonding ends on top of the first film.

Furthermore, in the method for manufacturing a semiconductor device according to the present invention, in the fourth step, a plurality of plating layers is stacked successively on top of the first electrode.

Furthermore, in the method for manufacturing a semiconductor device according to the present invention, the fourth step includes at least a step of forming a nickel layer on the first electrode by an electroless plating process, or a step of forming a nickel layer on the first electrode by an electroplating process.

Furthermore, in the method for manufacturing a semiconductor device according to the present invention, in the first step, the first electrode is formed on one main surface side of the semiconductor wafer, and a second electrode is formed on the other main surface side of the semiconductor wafer, and in the second step, the first film is bonded on the other main surface side of the semiconductor wafer so as to cover the second electrode.

As described above, according to the invention, by pressing the second film against the side surface of the semiconductor wafer by the first roller and sandwiching the end portion of the second film by the main surface of the semiconductor wafer by the second roller, it is possible to bond the second film to the outer peripheral portion of the semiconductor wafer without giving rise to wrinkles or locations which separate from the semiconductor wafer. Consequently, it is possible to prevent the plating solution that has penetrated into the adhesive layer from the end portions in the widthwise direction of the second film during the plating process from reaching the side surfaces of the semiconductor wafer. Accordingly, the plating solution is prevented from contacting the portion of the semiconductor wafer where the plating layer is not to be formed.

Moreover, according to the invention described above, by controlling the first roller and the second roller, as appropriate, it is possible to readily make the end portions of the second film in the direction along the outer periphery of the semiconductor wafer (the lengthwise direction of the second film) overlap with each other, and it is also possible readily to form a projecting section that becomes a holding section for separation when separating the second film, in the end portion in the lengthwise direction of the second film. By causing the end portions in the lengthwise direction of the second film to overlap with each other, it is possible to prevent the plating solution that has permeated into the adhesive layer from the end portions in the lengthwise direction of the second film, from reaching the side surfaces of the semiconductor wafer. Moreover, it is possible to separate the second film readily by holding the projecting section in the lengthwise direction of the second film, and rotating the semiconductor wafer or pulling the projecting section.

According to the method for manufacturing a semiconductor device according to the present invention, a beneficial effect is obtained in that abnormal precipitation of a plating layer in a portion where a plating layer is not to be formed can be prevented. Furthermore, according to the method for manufacturing a semiconductor device according to the present invention, a beneficial effect is obtained in that, when carrying out a plating process in a prescribed portion, bonding of a protective film to a portion where a plating layer is not to be formed and separation of the protective film can be carried out stably.

BRIEF DESCRIPTION OF THE DRAWINGS

FIG. 13 is a characteristics diagram showing a relationship between the Shore hardness and durability of the pressing roller;

FIG. 14 is a characteristics diagram showing a relationship between the pressing pressure and durability of the pressing roller;

FIG. 15 is a characteristics diagram showing a relationship between the angle of the V groove and the durability of the pressing roller;

FIG. 16 is a characteristic diagram showing a relationship between the sandwiching pressure of the sandwiching roller and the state immediately after bonding the second film; and FIG. 17 is a characteristic diagram showing a relationship between the sandwiching pressure of the sandwiching roller and the state immediately after bonding the second film.

DESCRIPTION OF THE PREFERRED EMBODIMENTS

Figure 1:
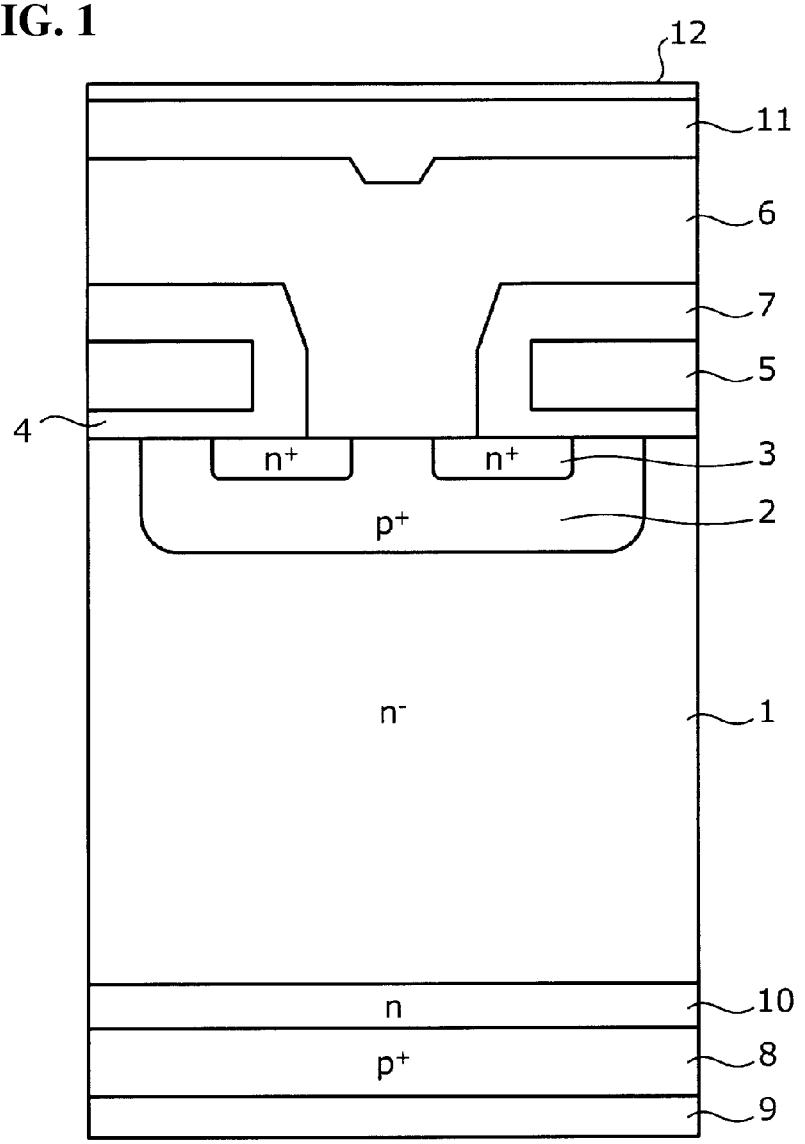
FIG. 1 is a cross-sectional diagram showing the configuration of a semiconductor device manufactured by the method for manufacturing a semiconductor device according to an embodiment of the invention.

Preferred embodiments of a method for manufacturing a semiconductor device according to this invention are described below with reference to the accompanying drawings. In the present specification and the accompanying drawings, a layer or region which is prefixed with n or p means that electrons or holes are the majority carrier in the layer or region in question, respectively. Furthermore, a + or − sign attached to the n or p means that the layer or region in question has a high impurity concentration or low impurity concentration, respectively, compared to a layer or region to which the sign is not attached. In the following description of the embodiments and the accompanying drawings, similar parts of the composition are labeled with the same reference numerals, and repeated description thereof is omitted.

Embodiment

Firstly, a semiconductor device which is manufactured by the method for manufacturing a semiconductor device according to an embodiment will be described, taking as an example a field stop (FS)-type IGBT having a planar gate structure. FIG. 1 is a cross-sectional diagram showing the configuration of a semiconductor device manufactured by the method for manufacturing a semiconductor device according to this embodiment. As shown in FIG. 1, the semiconductor device according to the present invention has a front surface element structure in which, for example, an n⁻ type semiconductor substrate (FZ substrate) manufactured by a floating zone method is used as an n⁻ type drift layer 1, and a MOS gate (insulated gate comprising metal-oxide film-semiconductor) structure is formed on one main surface (front surface) side thereof. The n⁻ type drift layer 1 has the function of an active layer. The MOS gate structure includes a p⁺ type base region 2, an n⁺ type emitter region 3, a gate insulation film 4 and a gate electrode 5.

More specifically, a p⁺ type base region 2 is provided selectively on the surface layer on one main surface of the n⁻ type semiconductor substrate. An n⁺ type emitter region 3 is provided selectively inside the p⁺ type base region 2. A gate electrode 5 is provided on the surface of the portion of the p⁺ type base region 2 that is sandwiched between the n⁻ type drift layer 1 and the n⁺ type emitter region 3, via a gate insulation film 4. The emitter electrode 6 is connected to the n⁺ type emitter region 3 and the p⁺ type base region 2 via a contact hole which passes through an interlayer insulation film 7 in the depth direction, and is also electrically insulated from the gate electrode 5 by the interlayer insulation film 7. The emitter electrode 6 is desirably a metal layer of which the main component is aluminum (Al), for example. The reason for this is that the adhesiveness between the emitter electrode 6 and the semiconductor part can be improved.

A nickel (Ni) plating layer 11 and a gold (Au) plating layer 12 are stacked successively on the surface of the emitter electrode 6. The nickel plating layer 11 and the gold plating layer 12 have an emitter potential and function as an emitter electrode 6. An external connection terminal (for example, a circuit pattern and/or plate-shaped conductor on an insulating substrate), which is not illustrated, for leading the emitter electrode 6 to the outside is soldered to the surface of the gold plating layer 12, and the nickel plating layer 11 and the gold plating layer 12 are melted by the soldering with the external connection terminal (solder erosion). The nickel plating layer 11 has a function for improving the adhesiveness with the solder, when soldering to the external connection terminal. The gold plating layer 12 has a function for preventing oxidation of the nickel plating layer 11. The thickness of the nickel plating layer 11 may be approximately 5 μm, for example. The thickness of the gold plating layer 12 may be approximately 0.03 μm, for example.

An n-type buffer layer 10 is provided on the surface layer on the other main surface (rear surface) of the n⁻ type semiconductor substrate, and a p⁺ type collector layer 8 is provided on the n-type buffer layer 10. A collector electrode 9 is provided on the surface of the p⁺ type collector layer 8. Although not shown in the drawings, the collector electrode 9 may be a stacked film in which an aluminum layer, titanium (Ti) layer, nickel layer and gold layer are stacked in succession. An external connection terminal (not illustrated) for leading the collector electrode 9 to the outside is soldered to the surface of the collector electrode 9, and the nickel layer and the gold layer constituting the collector electrode 9 is melted by the soldering with the external connection terminal. The nickel layer and the gold layer constituting the collector electrode 9 respectively have similar effects to the nickel plating layer 11 and the gold plating layer 12. The titanium layer which constitutes the collector electrode 9 has a function for preventing contact between the solder layer and the aluminum layer which has low adhesiveness with the solder.

Figure 2:
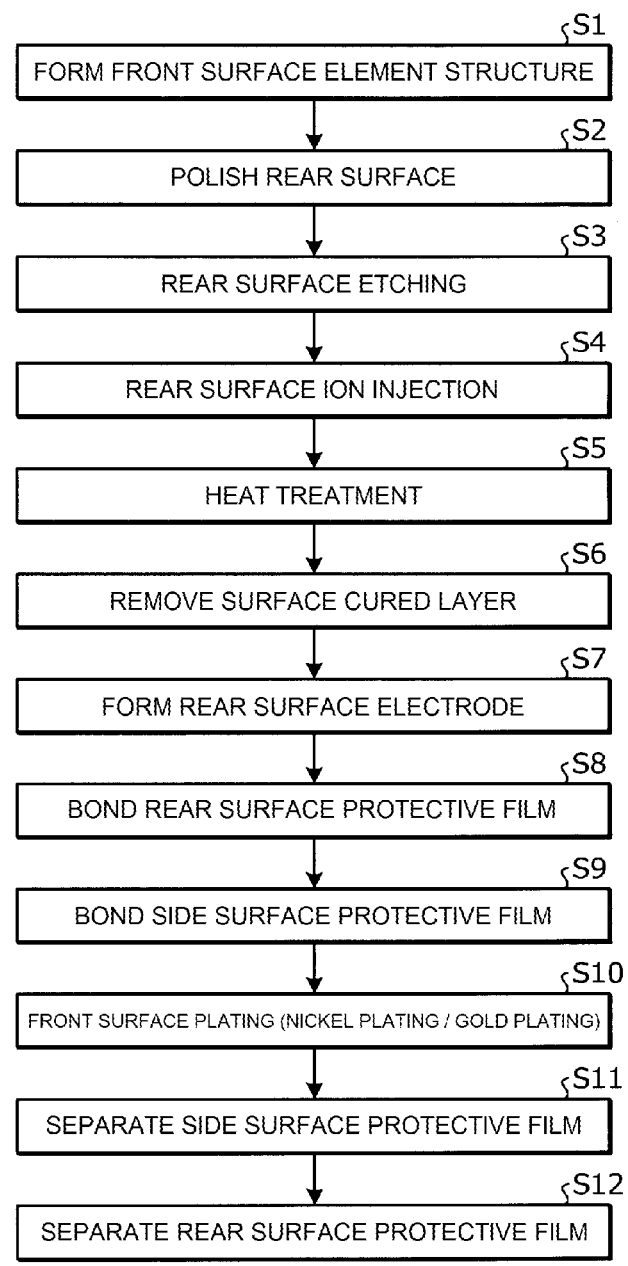
FIG. 2 is a flowchart showing an overview of a method for manufacturing a semiconductor device according to the embodiment.
Figure 9:
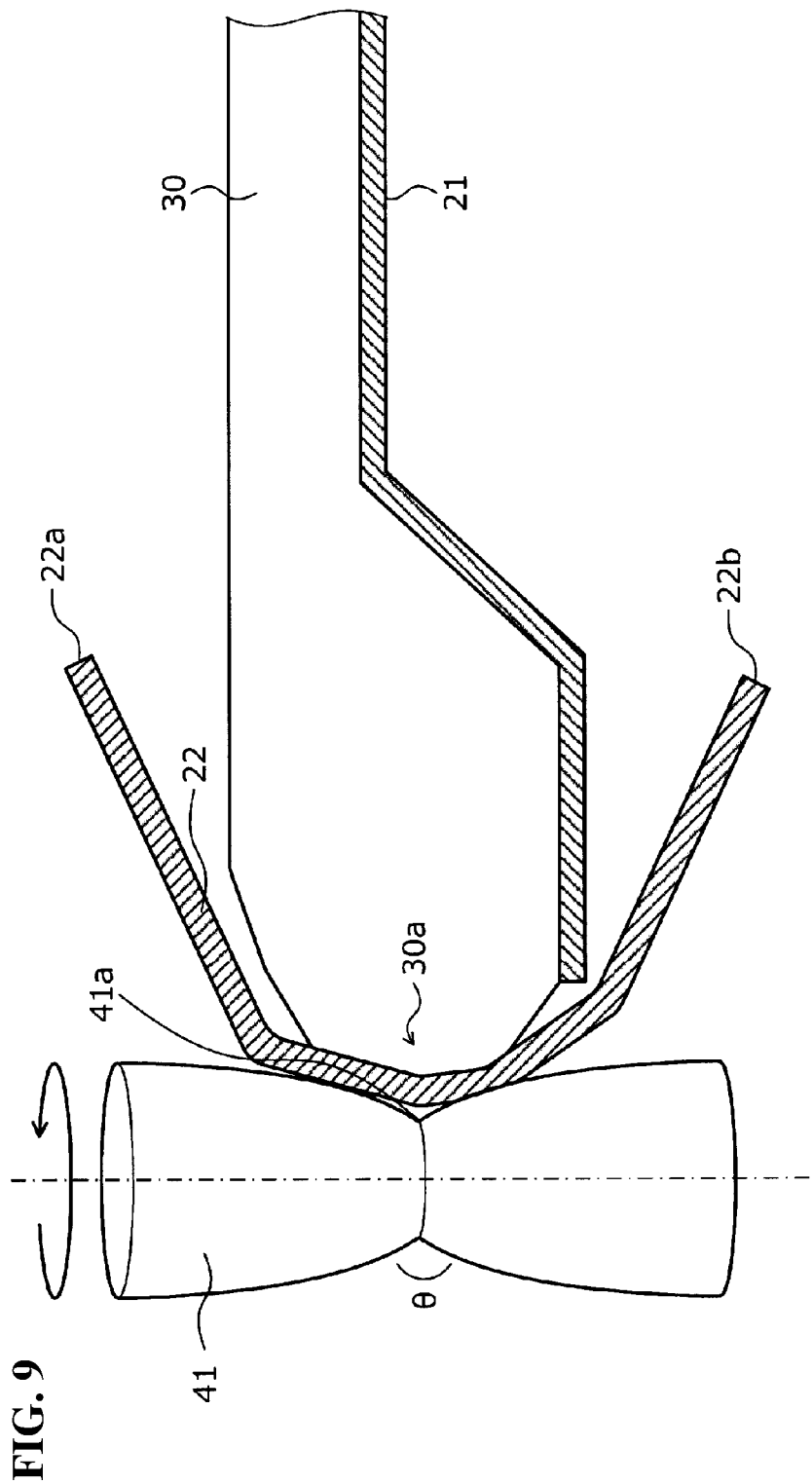
FIG. 9 is a cross-sectional diagram showing a state during the course of the manufacture of a semiconductor device according to the embodiment.
Figure 10:
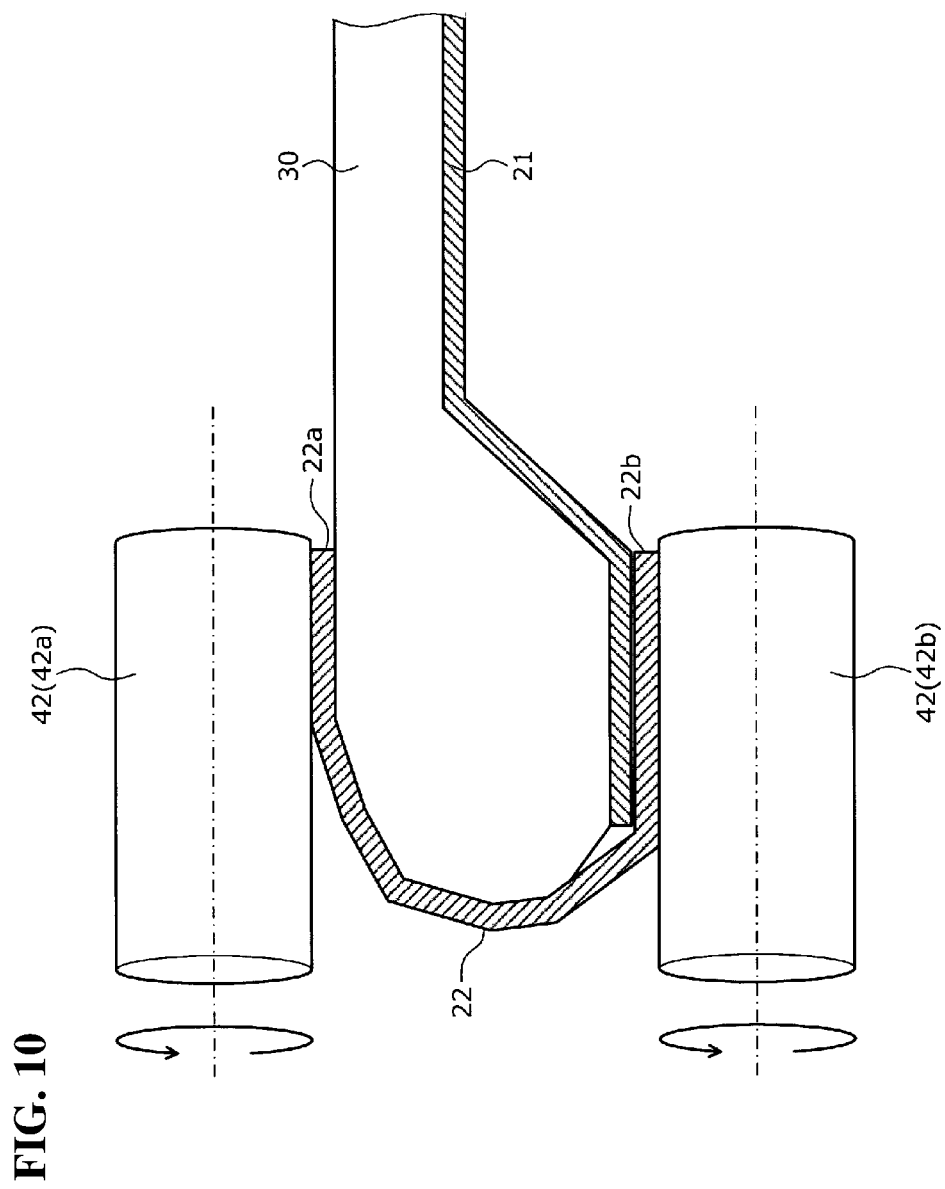
FIG. 10 is a cross-sectional diagram showing a state during the course of the manufacture of a semiconductor device according to the embodiment.
Figure 11:
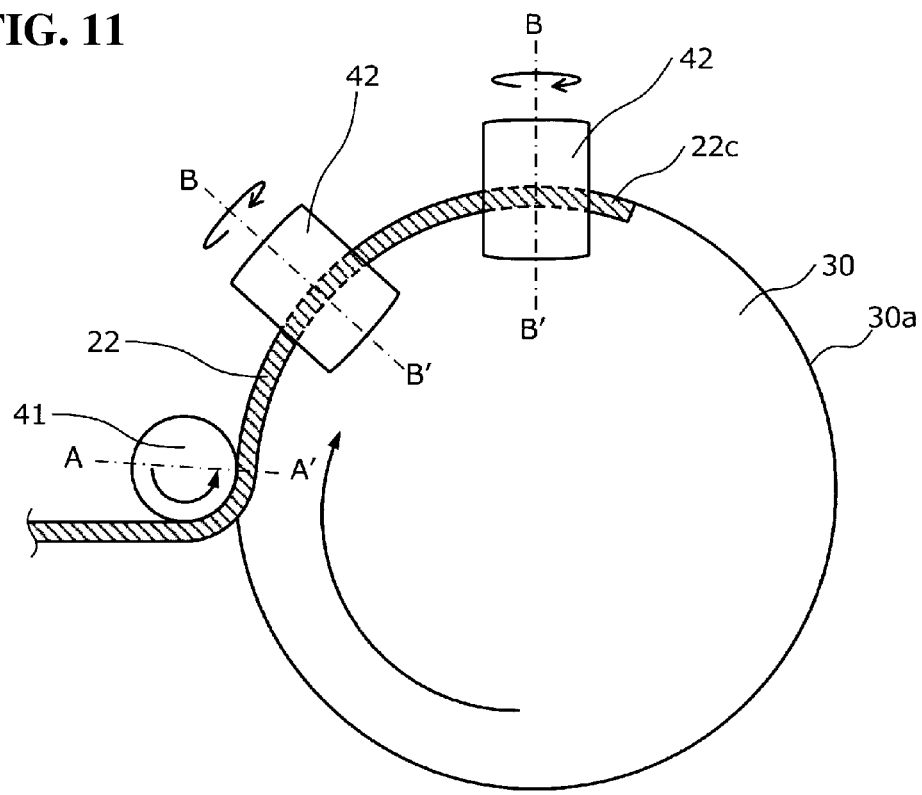
FIG. 11 is a plan diagram showing a state during the course of the manufacture of a semiconductor device according to the embodiment.
Figure 12:
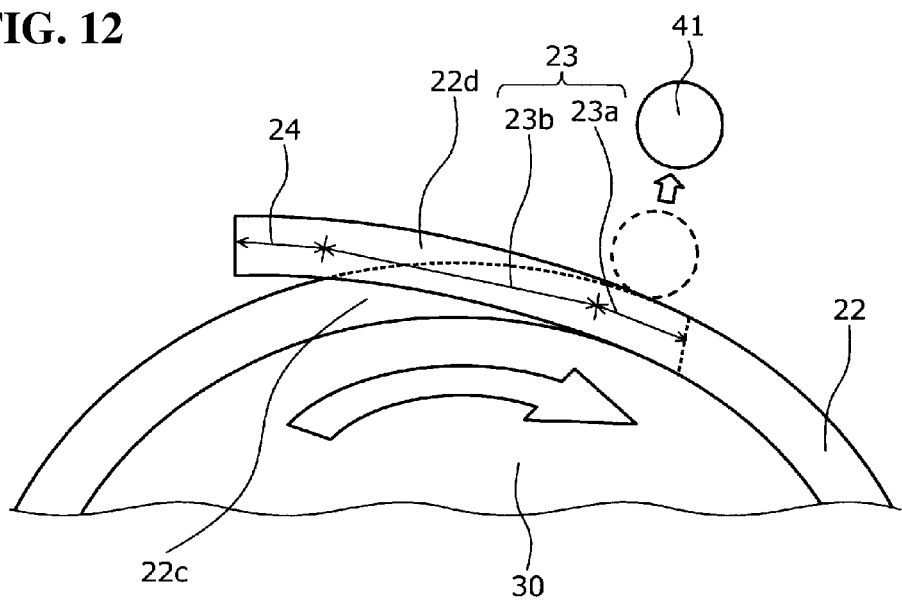
FIG. 12 is a plan diagram showing a state during the course of the manufacture of a semiconductor device according to the embodiment.

Next, a method for manufacturing a semiconductor device according to the embodiment will be described by taking, as an example, a case of manufacturing the FS-type IGBT shown in FIG. 1. FIG. 2 is a flowchart showing an overview of a method for manufacturing a semiconductor device according to an embodiment. FIGS. 3 to 6 and 8 to 10 are cross-sectional diagrams showing a state during manufacture of a semiconductor device according to the embodiment. FIGS. 7, 11 and 12 are plan diagrams showing a state during manufacture of a semiconductor device according to the embodiment. FIGS. 7, 11 and 12 show a state where the semiconductor wafer 20 is viewed from the front surface side. FIGS. 3 to 12 show the states during manufacture in each of the steps in FIG. 2. FIGS. 3 to 7 show states during manufacture taking, as an example, a case where a normal semiconductor wafer 20 having a uniform thickness is used. FIGS. 8 to 12 show states during manufacture taking, as an example, a case where a rib-shaped semiconductor wafer 30 having a reduced thickness in a central section 31 and having an outer peripheral portion 32 left to a large thickness in a prescribed width is used. FIG. 9 is a cross-sectional diagram along the sectional line A-A' in FIG. 11. FIG. 10 is a cross-sectional diagram in a plane passing through the center line B-B' of a sandwiching roller described below, and perpendicular to the main surface of the semiconductor wafer 30.

Figure 3:
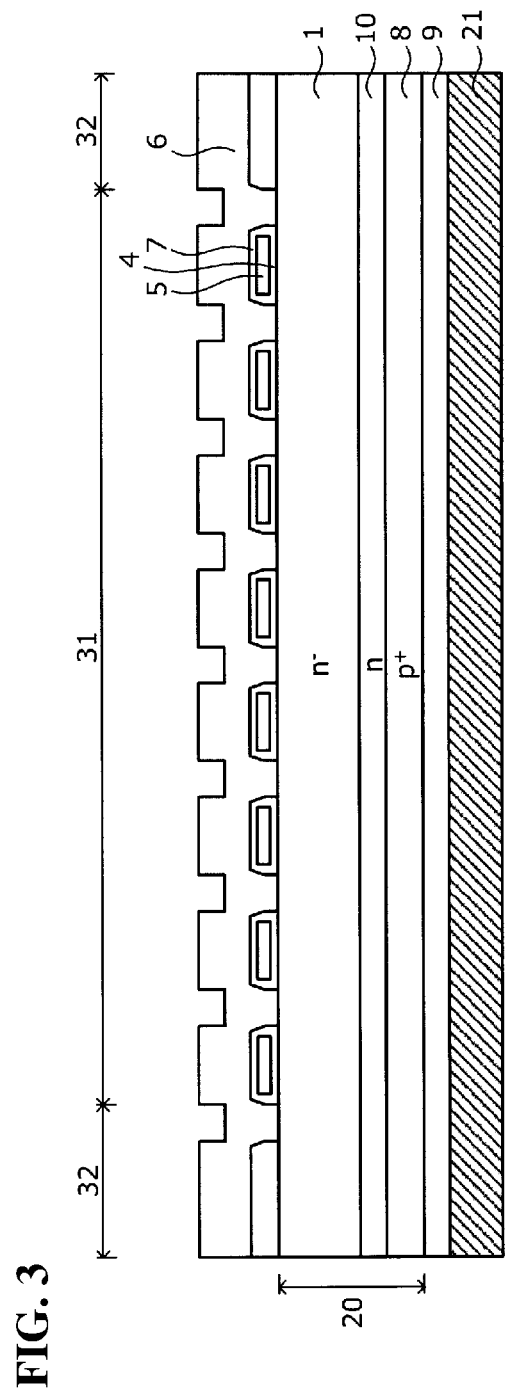
FIG. 3 is a cross-sectional diagram showing a state during the course of the manufacture of a semiconductor device according to the embodiment.

Firstly, as shown in FIG. 3, a front surface element structure comprising a MOS gate structure, an emitter electrode 6 and an interlayer insulation film 7, and the like, is formed on the central section 31 of the front surface of the n⁻ type semiconductor wafer (FZ wafer) 20 which has a substantially uniform thickness of 600 μm, for example, and forms an n⁻ type drift layer 1 (step S1). The emitter electrode 6 is formed by vapor deposition or sputtering, for example. In FIG. 3, the p⁺ type base region 2 and the n⁺ type emitter region 3 which constitute the MOS gate structure are not depicted (the same applies to FIGS. 4 to 6). Of the semiconductor wafer 20, the section apart from the p⁺ type base region 2 and the n⁺ type emitter region 3, and the p⁺ type collector layer 8 and the n-type buffer layer 10 which are formed in subsequent steps, form an n⁻ type drift layer 1. Next, the semiconductor wafer 20 is polished from the rear surface side (back-grinding) to a thin thickness of up to approximately 100 μm, for example.

Thereupon, the entire rear surface of the semiconductor wafer 20 is removed uniformly by etching, and the thickness of the semiconductor wafer 20 is further reduced to approximately 20 μm (step S3). In step S3, by etching the entire rear surface of the semiconductor wafer 20, it is possible to eliminate defects caused to the rear surface after polishing of the semiconductor wafer 20, as well as being able to alleviate the stress applied to the semiconductor wafer 20. By the steps up to this point, the thickness of the semiconductor wafer 20 becomes approximately the same as the product thickness when used as a semiconductor device. Next, after washing the semiconductor wafer 20, ion injection of n-type impurity in order to form an n-type buffer layer 10, and ion injection of p-type impurity in order to form a p⁺ type collector layer 8, is carried out successively on the rear surface of the semiconductor wafer 20 (step S4). The sequence of the ion injection in step S4 can be altered variously.

Next, heat treatment is carried out in order to activate the impurities that have been injected into the semiconductor wafer 20 (step S5), and the n-type buffer layer 10 and the p⁺ type collector layer 8 are formed on the rear surface side of the semiconductor wafer 20. Thereupon, the surface hardening layer, such as a natural oxide film, or the like, formed on the surface layer of the p⁺ type collector layer 8 is removed by dilute hydrofluoric acid (HF) (step S6). Next, a collector electrode 9 that is to form a rear surface electrode is formed on the surface of the p⁺ type collector layer 8 (step S7). The collector electrode 9 is formed by successively stacking, for example, an aluminum layer, a titanium layer, a nickel layer and a gold layer, by vapor deposition or sputtering. Next, a first film (rear surface protective film) 21 is bonded to the whole of the rear surface side of the semiconductor wafer 20, in other words, the entire surface of the collector electrode 9 (step S8). Furthermore, step S7 described above may be omitted. For example, rather than forming an electrode on the rear surface side of the semiconductor wafer 20, the first film 21 may be bonded to the entire surface of the rear surface side of the semiconductor wafer 20.

The first film 21 includes a base material and an adhesive layer (not illustrated), and the adhesive layer side thereof is bonded to the wafer. After the first film 21 has been bonded to the surface of the collector electrode 9, or while the first film 21 is being bonded to the surface of the collector electrode 9, air remaining between the semiconductor wafer 20 and the first film 21 may be pushed out by mechanically pressing the first film 21 against the semiconductor wafer 20, for example. The bonding of the first film 21 may be carried out in a chamber (not illustrated) in a reduced-pressure atmosphere, and desirably, a vacuum atmosphere. The reason for this is that it is possible to prevent air from being left between the first film 21 and the semiconductor wafer 20, by bonding the first film 21 in a reduced-pressure atmosphere.

The diameter of the first film 21 may be a dimension approximately the same as the diameter of the semiconductor wafer 20, or a dimension that is approximately 1 mm, for example, smaller than the diameter of the semiconductor wafer 20 (desirably approximately 0.5 mm smaller). The reason for this is that when the first film 21 projects outward beyond the outer peripheral portion 32 of the semiconductor wafer 20 after the first film 21 has been bonded to the semiconductor wafer 20, then the second film 22 (described below) which covers the side portion 20a of the semiconductor wafer 20 (the substantially flat portion of the side surface of the semiconductor wafer 20 which is substantially orthogonal with the front surface) is not liable to bond, and air is liable to remain between the semiconductor wafer 20 and the second film 22. A first film 21 which has chemical resistant properties in respect of the plating solution for the plating process described hereinafter, and/or heat resistant properties in respect of the temperature of the plating solution, is used. More specifically, since the temperature of the plating solution is approximately 80° C., for example, the first film 21 desirably has heat resistant properties at approximately 100° C. for example.

It is possible to use an adhesive of which the adhesive strength is reduced by irradiating ultraviolet light (UV light), for example, as the material of the adhesive layer (not illustrated) of the first film 21. More specifically, the first film 21 may be an ultraviolet-transmissive UV film, having a thickness of no less than 10 μm and no more than 50 μm, for example. For the material of the first film 21, for example, it is possible to use a film made from polyethylene terephthalate (PET), polyimide, polyolefin, polycarbonate, vinyl chloride, polypropylene, ABS resin (Acrylonitrile Butadiene Styrene copolymer), nylon or polyurethane.

Figure 8:
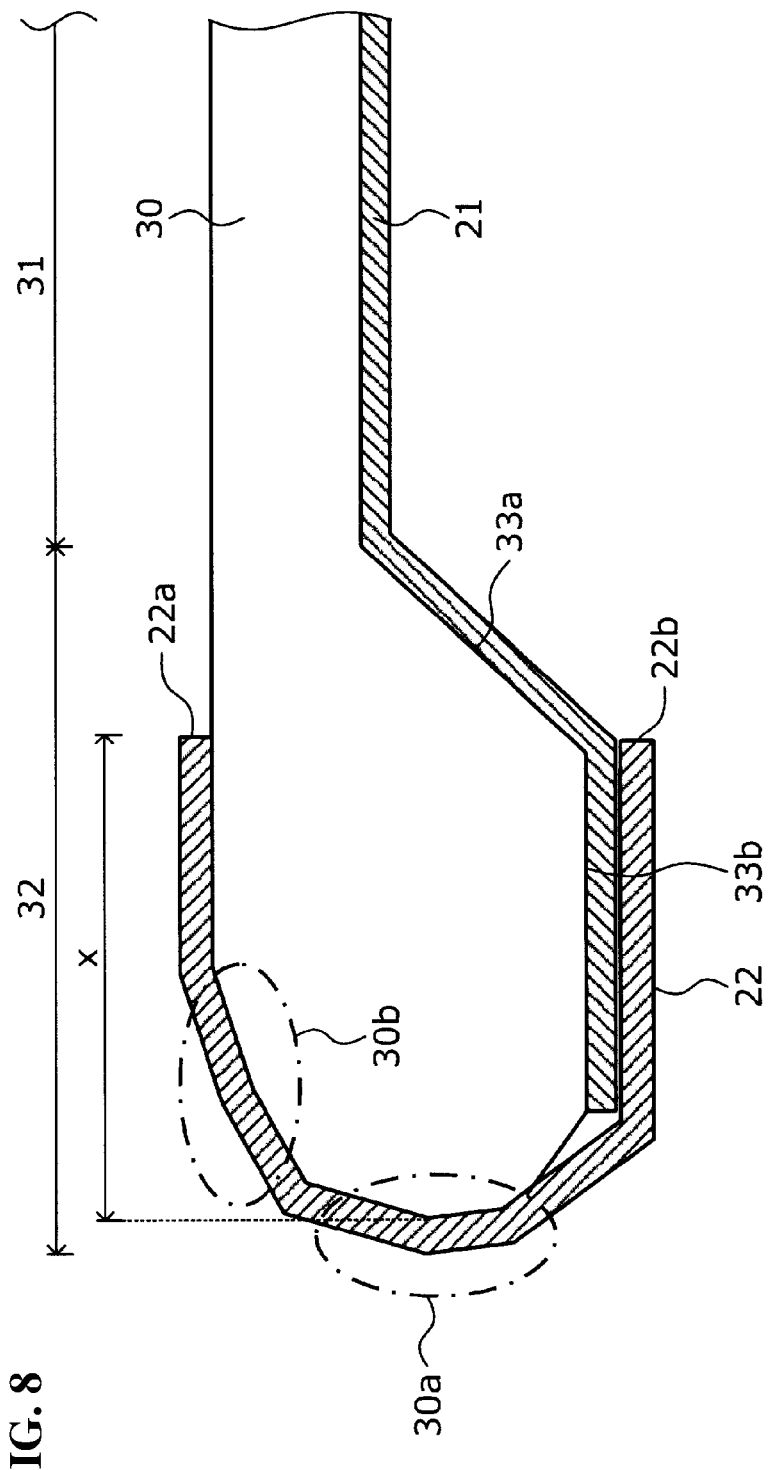
FIG. 8 is a cross-sectional diagram showing a state during the course of the manufacture of a semiconductor device according to the embodiment.

Furthermore, when polishing the rear surface in step S2 described above, it is possible to adopt a rib-shaped semiconductor wafer 30 in which only the thickness of the central section 31 is reduced, and the outer peripheral portion 32 is left thick in a prescribed width (see FIG. 8). The outer peripheral portion 32 of the rib-shaped semiconductor wafer 30 acts as a reinforcing member for the semiconductor wafer 30. Therefore, even if the thickness of the central section 31 of the semiconductor wafer 30 is reduced in order to raise the heat dispersion properties, for example, it is still possible to maintain the strength of the semiconductor wafer 30. When a rib-shaped semiconductor wafer 30 of this kind is adopted, then the first film 21 is bonded to the rear surface of the semiconductor wafer 30 so as to follow a step difference section 33a of the outer peripheral portion 32 which occurs due to the thickness differential with the central section 31. In other words, the first film 21 covers the central section 31 of the rear surface of the semiconductor wafer 30, the step difference section 33a of the outer peripheral portion 32, and a flat section 33b of the outer peripheral portion 32 which is parallel to the main surface of the wafer. In this case, the diameter of the first film 21 should be a dimension whereby the first film 21 does not project outward beyond the flat section 33b of the outer peripheral portion 32 of the semiconductor wafer 30, in a state where the first film 21 is bonded.

The method of manufacture in the case of using a rib-shaped semiconductor wafer 30 differs from the method of manufacture in the case of using a normal semiconductor wafer 20 having a uniform thickness in that the rear surface polishing in step S2 is only carried out in the central section 31. Therefore, in the case of using a rib-shaped semiconductor wafer 30, step S1 is carried out similarly to the normal semiconductor wafer 20, and after forming a rib shape in step S2, the steps from step S3 onwards should be carried out similarly to a normal semiconductor wafer 20. In FIG. 8, the front surface electrode structure, such as the MOS gate structure, the emitter electrode 6 and the interlayer insulation film 7, etc., and the rear surface electrode structure, such as the $p^+$ type collector layer 8, the n-type buffer layer 10 and the collector electrode 9, etc. are omitted (the same applies to FIGS. 9 and 10). In both the normal semiconductor wafer 20 and the rib-shaped semiconductor wafer 30, the central section 31 is a chip valid region which can be cut out in individual chip shapes by dicing, which is described hereinafter, for example, and the outer peripheral portion 32 is a chip invalid region which is discarded after dicing, for example.

Figure 4:
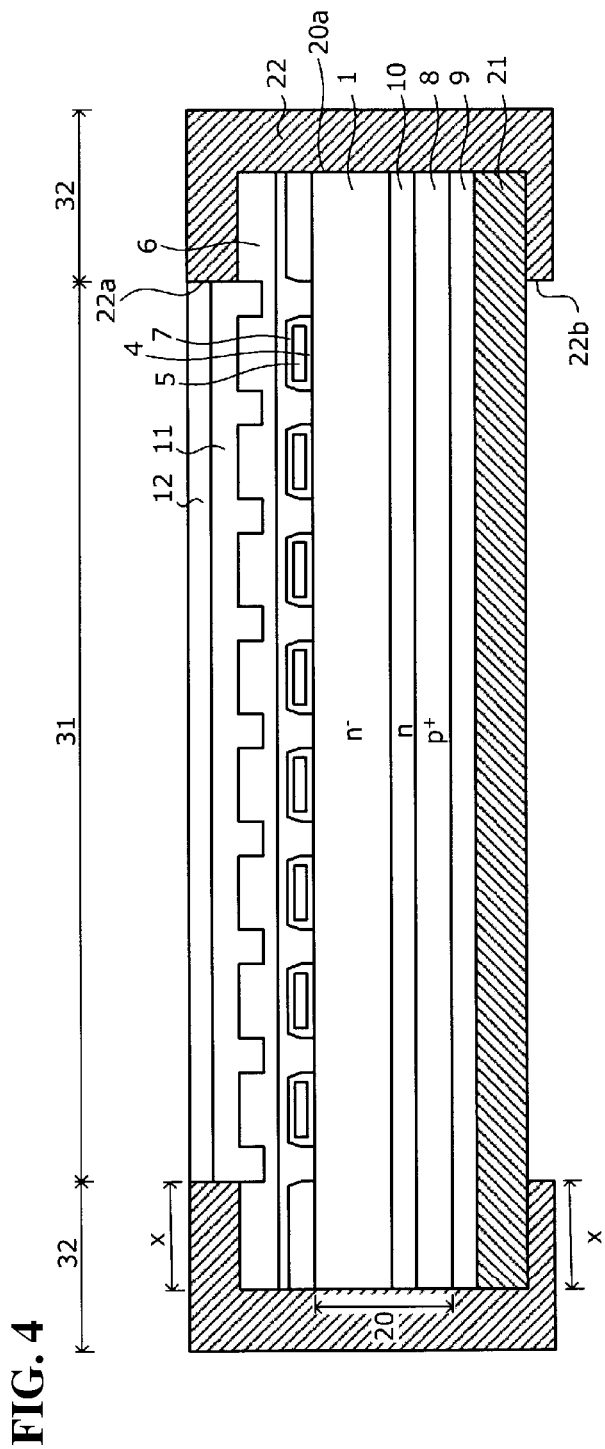
FIG. 4 is a cross-sectional diagram showing a state during the course of the manufacture of a semiconductor device according to the embodiment.

Next, as shown in FIG. 4, a second film (side surface protection film) 22 is bonded to the outer peripheral portion 32 of the semiconductor wafer 20 so as to cover the side section 20a of the semiconductor wafer 20 (step S9). The second film 22 includes a base material and an adhesive layer (not illustrated), and the adhesive layer side is bonded to the wafer side. The second film 22 has a substantially rectangular band shape, and the side section 20a of the semiconductor wafer 20 covers the outer peripheral portion 32 of the semiconductor wafer 20 from the front surface side to the rear surface side in the widthwise direction of the second film 22. More specifically, one end portion 22a in the widthwise direction of the second film 22 is situated on the front surface of the semiconductor wafer 20, and the other end portion 22b in the widthwise direction of the second film 22 is situated on the rear surface of the semiconductor wafer 20. In other words, the second film 22 is bonded from the front surface to the rear surface of the semiconductor wafer, and covers the side section 20a of the semiconductor wafer 20 and/or the chamfered section (not illustrated) of the semiconductor wafer 20. The chamfered section of the semiconductor wafer 20 is the portion of the side surface of the semiconductor wafer 20 other than the side section 20a, and is a substantially circular arc-shaped portion at the upper end/lower end of the side surface of the semiconductor wafer 20.

The second film 22, for example, covers a dicing line, for example, (a cutting line for cutting into chip shapes) which is formed on the outer peripheral portion 32 of the semiconductor wafer 20 on the front surface of the semiconductor wafer. Furthermore, the second film 22 is bonded so as to reach to the central section 31 of the semiconductor wafer 20, which is the chip valid region. More specifically, when using a semiconductor wafer 20 having an 8-inch diameter, for example, in the portion of the outer peripheral portion 32 of the semiconductor wafer 20 from the side section 20a passing on the inner side via the chamfered section to the flat section, the width x of the portion covered by the second film 22 may be approximately no less than 1.5 mm and no more than 3 mm, for example. For example, when using a semiconductor wafer 20 having a small diameter, such as a semiconductor wafer 20 having a 6-inch diameter, or the like, the curvature of the chamfered section of the semiconductor wafer 20 is large and the amount of curve of the chamfered section is large (tight). Therefore, the smaller the diameter of the semiconductor wafer 20, the greater the length to which the second film 22 should be formed in the widthwise direction.

Furthermore, the end portions 22a, 22b of the second film 22 in the widthwise direction desirably extend to approximately no less than 1 mm, for example, on the flat section on the inner side (central section 31 side) of the chamfered section. The reason for this is that the adhesive strength of the end portions 22a, 22b in the widthwise direction of the second film 22 can be increased. Consequently, during the plating process, the plating solution can be prevented from infiltrating from the end portions 22a, 22b in the widthwise direction of the second film 22. Furthermore, the other end portion 22b in the widthwise direction of the second film 22 desirably terminates on the first film 21 so as to overlap with the end portion of the first film 21 which is bonded to the rear surface of the semiconductor wafer 20. Moreover, as shown in FIG. 8, when using the rib-shaped semiconductor wafer 30, the other end portion 22b in the widthwise direction of the second film 22 desirably overlaps with the first film 21 so as to entirely cover the flat section 33b on the rear surface side of the outer peripheral portion 32 of the semiconductor wafer 30. In the portion of the outer peripheral portion 32 of the semiconductor wafer 30 from the side section 30a, passing on the inside via the chamfered section 30b to the flat section, the width x of the portion covered by the second film 22 is similar to the normal semiconductor wafer 20.

Moreover, as shown in FIGS. 7 and 12, the second film 22 is bonded over at least the entire outer periphery of the semiconductor wafer 20, 30 in the lengthwise direction of the second film 22. Furthermore, the two end portions 22c, 22d in the lengthwise direction of the second film 22 desirably overlap by approximately no less than 1 cm and no more than 5 cm, for example (the portion indicated by reference numeral 23). The reason why the overlap width between the two end portions 22c, 22d in the lengthwise direction of the second film 22 is set to approximately no less than 1 cm is because the two end portions 22c, 22d in the lengthwise direction of the second film 22 can be caused to adhere together reliably. Consequently, it is possible to prevent separation of the second film 22 during the plating process, which is described below. The reason for setting the width of the overlap between the two end portions 22c, 22d in the lengthwise direction of the second film 22 to approximately no more than 5 cm is because it is desirable to reduce the amount of second film 22 used, from the viewpoint of economic efficiency. Moreover, desirably, in one end portion 22d (called the "finish end portion" below) in the lengthwise direction of the second film 22, which is on the bonding finish point side, the portion on the bonding finish point side (free end side) from the portion 23 (called the "overlap section" below) which overlaps with the other end portion 22c (called the "start end portion" below) in the lengthwise direction of the second film 22, which is on the bonding start point side, is left intentionally as a projecting section 24.

This projecting section 24 of the finish end portion 22d of the second film 22 forms a holding part for the purpose of separation by film holding means (for example, a head roller provided with a suction head (not illustrated)), when the second film 22 is separated from the semiconductor wafer 20, 30. Of the overlap section 23 of the finish end portion 22d of the second film 22, a first portion 23a which is distant from the projecting section 24 is the pressing end position of the pressing roller (first roller) 41 (see FIG. 9) (described hereinafter) that is used when bonding the second film 22, and this first portion 23a adheres reliably to the start end portion 22c of the second film 22. On the other hand, of the overlap section 23 of the finish end portion 22d of the second film 22, the second portion 23b on the side of the projecting section 24 is a portion which does not receive pressure from the pressing roller 41 and hence the adhesion between the second film 22 and the start end portion 22c is weaker, the nearer the position to the projecting section 24. In other words, the second portion 23b on the side of the projecting section 24 is separated from the start end portion 22c of the second film 22 in the side section 30a of the outer peripheral portion 32 of the semiconductor wafer 20, 30, and adheres tightly to the end portions 22a, 22b in the widthwise direction of the start end portion 22c of the second film 22 in the respective flat sections on the front surface side and the rear surface side of the outer peripheral portion 32 of the semiconductor wafer 20, 30. Therefore, the adhesion between the second portion 23b on the side of the projecting section 24 and the start end portion 22c of the second film 22 which is bonded to the side section 20a, 30a of the semiconductor wafer 20, 30, is weak. Therefore, when separating the second film 22 from the semiconductor wafer 20, 30, it is possible to separate the second film 22 easily as described below, by holding the projecting section 24 by film holding means.

When the second film 22 is bonded to the outer peripheral portion of the semiconductor wafer 20, 30, the semiconductor wafer 20, 30 should be fixed to a stage (not illustrated) provided with a vacuum chuck for suctioning the semiconductor wafer 20, 30, for example, and the second film 22 should be bonded while rotating the stage about an axis of rotation on the center line thereof. More specifically, the method for bonding the second film 22 to the outer peripheral portion 32 of the semiconductor wafer 20, 30 is as follows. The method for bonding the second film 22 is described here with reference to FIGS. 9 to 12 which illustrate the use of a rib-shaped semiconductor wafer 30. In the case of using a normal semiconductor wafer 20, although not shown in the drawings, the second film 22 should be bonded by a similar bonding method as when using a rib-shaped semiconductor wafer 30. Firstly, the semiconductor wafer 30 is placed with the rear surface facing downwards, for example, on a stage having a smaller diameter than the diameter of the semiconductor wafer 30.

Next, a second film 22 wrapped in the form of a roll and sandwiched by a separator (for example, a protective film made of PET) so that the second film 22 does not bond to itself, for example, is prepared. Thereupon, the free end of the second film 22 is suctioned and held by the head roller (not illustrated), the second film 22 is wound out while peeling off the separator, the head roller is moved to the side of the semiconductor wafer 30, and the adhesive layer of the second film 22 contacts the side section 30a of the semiconductor wafer 30. The free end of the second film 22 which has been placed in contact with the side section 30a of the semiconductor wafer 30 by the head roller forms a start end portion 22c. Next, as shown in FIG. 9, the pressing roller 41 is placed in contact with the start end portion 22c of the second film 22, and the second film 22 is pressed against the side surface of the semiconductor wafer 30 (in particular, the side section 30a of the semiconductor wafer 30) by the pressing roller 41. The material of the second film 22 (the base material and the adhesive layer) may be the same as the first film 21. Furthermore, the material of the second film 22 is desirably a polyolefin film which has excellent heat resistant properties and expandability and contractibility, or a polyimide film which has excellent heat resistant properties and chemical resistant properties.

The pressing roller 41 is a round cylindrical roller made of an elastic body (for example, urethane rubber), which is disposed in a rotatable state about an axis of rotation on the center line thereof, and in a movable state in a direction towards the side section 30a of the semiconductor wafer 30 (a direction perpendicular to the center line). On the side surface of the pressing roller 41, a substantially V-shaped V groove 41a is provided so as to extend over the entire circumference of the side surface in parallel with the direction perpendicular to the center line, in the portion facing the side section 30a of the semiconductor wafer 30. Therefore, the second film 22 is curved into substantially a V shape so as to follow the V groove 41a in the side surface of the pressing roller 41, due to being pressed by the pressing roller 41. In other words, by pressing the second film 22 on the side section 30a of the semiconductor wafer 30 by the pressing roller 41, the two end portions 22a, 22b in the widthwise direction of the second film 22 are respectively made to approach the two main surfaces of the semiconductor wafer 30. The V groove 41a of the pressing roller 41 is desirably formed to a shape which does not produce a gap, as far as possible, between the pressing roller 41 and the second film 22, or between the second film 22 and the side section 30a of the semiconductor wafer 30, when the pressing roller 41 and the side section 30a of the semiconductor wafer 30 contact via the second film 22. For example, the side wall of the V groove 41a of the pressing roller 41 may be a flat surface, or may be a surface which curves outwards in a circular arc shape (toward the side section 30a of the semiconductor wafer 30).

The pressure applied to the semiconductor wafer 30 by the pressing roller 41 (called the pressing pressure below) may be approximately no less than 50 kPa and no more than 300 kPa, for example, whereby a good state is achieved after the plating process, and desirably, approximately no less than 50 kPa and no more than 250 kPa, whereby the durability of the pressing roller 41 can be improved. The pressing pressure means the force applied to the semiconductor wafer 30 by the pressing roller 41 divided by the surface area of the contact between the pressing roller 41 and the semiconductor wafer 30. A good state after the plating process is a state where no separation of the second film 22 and no abnormal growth of the plating layer in the portion where the plating layer is not to be formed (simply called "abnormal growth of the plating layer" below) occurs after the plating process. The angle $\theta$ of the V groove 41a in the pressing roller 41 should be approximately no less than 20 degrees and no more than 160 degrees, and desirably, approximately no less than 30 degrees and no more than 160 degrees, whereby the durability of the pressing roller 41 can be further improved. The Shore hardness of the pressing roller 41 should be no less than 20 and no more than 90 approximately, whereby a good state after the plating process is achieved, and is desirably approximately no less than 30 and no more than 90, whereby the durability of the pressing roller 41 can be improved. The Shore hardness is a value which expresses the hardness of an elastic body, and is expressed a numerical value obtained by pressing a pressure element (needle or indenter) into the surface of an object to be measured (elastic body) and measuring the amount of deformation (penetration depth) thereof. The Shore hardness is measured using a type A Durometer (spring-type rubber hardness meter), on the basis of JIS K6253-3 "How to Determine hardness of vulcanized rubber and thermoplastic rubber—Part 3. Durometer hardness". The diameter of the pressing roller 41 should be a dimension which avoids bending and pressing in of the second film 22 (the formation of wrinkles) inside the notch portion or orientation flat section (not illustrated), which indicates the crystalline axis direction of the semiconductor wafer 30. More specifically, the diameter of the pressing roller 41 should be no less than 2 mm, for example, which is larger than the width of the notch section or the orientation flat section.

Next, the suction of the second film 22 by the head roller is ended, and the head roller is separated from the semiconductor wafer 30. Thereupon, as shown in FIG. 11, the semiconductor wafer 30 is rotated at least once, by rotating the stage about an axis of rotation on the center line thereof. In this case, since the pressing roller 41 is contacting the semiconductor wafer 30 via the second film 22, the pressing roller 41 rotates in the opposite direction to the direction of rotation of the semiconductor wafer 30, in accordance with the rotation of the semiconductor wafer 30. Therefore, by rotating the semiconductor wafer 30, it is possible to bond the second film 22 over the entire outer periphery of the semiconductor wafer 30 while pressing same against the side section 30a of the semiconductor wafer 30.

Moreover, by disposing a sandwiching roller (second roller) 42 so as to sandwich the outer peripheral portion 32 of the semiconductor wafer 30, and sandwiching the outer peripheral portion 32 of the semiconductor wafer 30 by the sandwiching roller 42 while rotating the semiconductor wafer 30, the second film 22 is caused to contact both main surfaces of the semiconductor wafer 30. More specifically, the sandwiching roller 42 includes a pair of cylindrical rollers 42a, 42b which respectively faces the two main surfaces of the semiconductor wafer 30. One roller 42a which constitutes the sandwiching roller 42 faces the front surface of the semiconductor wafer 30, and the other roller 42b faces the rear surface of the semiconductor wafer 30. In other words, one end portion 22a in the widthwise direction of the second film 22 is sandwiched between the roller 42a and the front surface of the semiconductor wafer 30, and the other end portion 22b in the widthwise direction of the second film 22 is sandwiched between the roller 42b and the rear surface of the semiconductor wafer 30.

Furthermore, the sandwiching rollers 42 are desirably made from a material that is not liable to deform, such as rubber or TEFLON™, nylon, DURACON™, or the like. The reason for this is that the positional accuracy of the sandwiching rollers 42 can be maintained, even when the sandwiching rollers 42 have deformed. Furthermore, if the sandwiching rollers 42 have deformed, there is a risk that the sandwiching rollers 42 may contact the portion of the central section 31 of the semiconductor wafer 30 where the second film 22 is not bonded. As described above, since the sandwiching rollers 42 lie in contact with the semiconductor wafer 30 via the second film 22, the sandwiching rollers 42 rotate in the opposite direction to the direction of rotation of the semiconductor wafer 30, in accordance with the rotation of the semiconductor wafer 30. Therefore, by causing the semiconductor wafer 30 to rotate, the two end portions 22a, 22b in the widthwise direction of the second film 22 can respectively be bonded to the two main surfaces of the semiconductor wafer 30, over the entire outer periphery of the semiconductor wafer 30. In other words, by causing the semiconductor wafer 30 to rotate, the pressing roller 41 and the sandwiching rollers 42 rotate in accordance with the rotation of the semiconductor wafer 30. Therefore, it is also possible to bond the second film 22 on the outer peripheral portion 32 of the semiconductor wafer 30, from the front surface side to the rear surface side of the semiconductor wafer 30, over the entire outer periphery of the semiconductor wafer 30.

More specifically, due to the pressing roller 41 which rotates in accordance with the rotation of the semiconductor wafer 30, the second film 22 is bonded to the side section 30a of the semiconductor wafer 30, as well as becoming curved, and two end portions 22a, 22b in the widthwise direction of the second film 22 are respectively made to approach the two main surfaces of the semiconductor wafer 30. In this way, the two end portions 22a, 22b in the widthwise direction of the second film 22 which have approached the two main surfaces of the semiconductor wafer 30 are bonded respectively to the two main surfaces of the semiconductor wafer 30 by the sandwiching rollers 42 which rotate in accordance with the rotation of the semiconductor wafer 30. In this case, desirably, the second film 22 is bonded to the two main surfaces of the semiconductor wafer 30 by the sandwiching rollers 42, while the second film 22 is being maintained in a curved state at a prescribed angle. Therefore, the sandwiching rollers 42 are desirably disposed at a position near to the pressing roller 41. Two or more (stages) of the sandwiching rollers 42 may be provided (see FIG. 11). By providing two or more sets of sandwiching rollers 42, it is possible to re-apply pressure to the end portions 22a, 22b in the widthwise direction of the second film 22 which have been bonded by the first-stage sandwiching roller 42. Therefore, the force of adhesion between the end portions 22a, 22b in the widthwise direction of the second film 22 and the semiconductor wafer 30 can be raised further.

If one set of sandwiching rollers 42 is disposed, then the pressure applied to the semiconductor wafer 20 which is sandwiched by the sandwiching rollers 42 (called the "sandwiching pressure" below) should be approximately no less than 20 kPa and no more than 150 kPa, whereby a good state is achieved immediately after bonding of the second film 22. If two sets of sandwiching rollers 42 are disposed, then the sandwiching pressure of the two sets of sandwiching rollers 42 should respectively be set to the following range whereby a good state is achieved immediately after bonding of the second film 22. The sandwiching pressure of the sandwiching rollers 42 which carry out bonding of the second film 22 after the pressing roller 41 (called the "first-stage sandwiching rollers 42" below) should be approximately no less than 20 kPa and no more than 200 kPa. The sandwiching pressure of the sandwiching rollers 42 which carry out bonding of the second film 22 following the first-stage sandwiching roller 42 (called the "second-stage sandwiching rollers 42" below") should be approximately no less than 20 kPa and no more than 400 kPa. By disposing a plurality of sandwiching rollers 42, even if the sandwiching pressure of the latter-stage sandwiching roller 42 is high, it is possible to prevent the occurrence of wrinkles in the second film 22 and/or the occurrence of locations which separate from the semiconductor wafer 20 in the end portions 22a, 22b of the widthwise direction of the second film 22. Therefore, it is possible to further increase the force of adhesion between the second film 22 and the semiconductor wafer 30.

Next, as shown in FIG. 12, the second film 22 is bonded over the entire outer periphery of the semiconductor wafer 30, and when the second film 22 has overlapped by a prescribed width with the start end portion 22c of the second film 22 (upon reaching the pressing end position of the pressing roller 41), the pressing roller 41 is separated from the semiconductor wafer 30. The portion of the second film 22 located at the pressing end position of the pressing roller 41 is the first portion 23a of the finish end portion 22d of the second film 22. The overlap width of the first portion 23a may be approximately 1 cm, for example. After the end of pressing by the pressing roller 41, the sandwiching rollers 42 only rotate in accordance with the rotation of the semiconductor wafer 30. Therefore, the second film 22 is bonded to both main surfaces of the semiconductor wafer 30, in a state where the force of adhesion with the side section 30a of the semiconductor wafer 30 is gradually reduced. The portion which is bonded to the semiconductor wafer 30 by the sandwiching rollers 42 alone is the second portion 23b of the finish end portion 22d of the second film 22.

After the end of pressing by the pressing roller 41, the sandwiching rollers 42 are separated from the two main surfaces of the semiconductor wafer 30 when the two end portions 22a, 22b in the widthwise direction of the second film 22 cease to face the two main surfaces of the semiconductor wafer 30. In other words, the sandwiching rollers 42 are separated from the two main surfaces of the semiconductor wafer 30, when the whole of the finish end portion 22d of the second film 22 has ceased to contact the start end portion 22c of the second film 22. Next, the portion of the second film 22 that is not bonded to the semiconductor wafer 30 (including the second film 22 bonded to the semiconductor wafer 30) is suctioned and held by the head roller (not illustrated). Thereupon, the second film 22 is cut leaving a prescribed width to the side of the portion suctioned by the head roller from the second portion 23b. The portion of the second film 22 which is left on the free end side from the second portion 23b is the projecting section 24 of the finish end portion 22d of the second film 22. The new free end, which is the portion of the second film 22 wrapped in the roll shape that is suctioned by the head roller, becomes the start end portion 22c of the second film 22 for bonding to another semiconductor wafer 30.

In this way, by controlling the operation of the semiconductor wafer 30, the pressing roller 41 and the sandwiching rollers 42, it is possible to increase the force of adhesion of the second film 22 by mutually overlapping the start end portion 22c and the finish end portion 22d of the second film 22. Furthermore, since a projecting section 24 that becomes a holding section for separation when separating the second film 22 from the semiconductor wafer 30 can be formed in the finish end portion 22d of the second film 22, it is possible to separate the second film 22 easily after the plating process described below. The overlap width of the first and second portions 23a, 23b of the finish end portion 22d of the second film 22 can be adjusted by variously modifying the speed of rotation of the semiconductor wafer 30, the pressing pressure of the pressing roller 41, and the speed of movement of the pressing roller 41 after ending the pressing of the pressing roller 41. The remaining width of the projecting section 24 of the finish end portion 22d of the second film 22 can be adjusted by variously modifying the cutting position of the second film 22.

Similarly to the first film 21, a second film 22 which has chemical resistant properties in respect of the plating solution used in the plating process described hereinafter, and/or heat resistant properties in respect of the temperature of the plating solution, is used. The adhesive layer of the second film 22 may use, for example, an acrylic adhesive, or an adhesive of which the force of adhesion is reduced by irradiating ultraviolet light, similarly to the adhesive layer of the first film 21. The thickness of the base material of the second film 22 may be approximately no less than 10 μm and no more than 100 μm, for example. For the base material of the second film 22, for example, it is desirable to use a base material having a certain degree of expandability and contractibility, in order that no gap occurs in the chamfered section 30b of the semiconductor wafer. More specifically, the base material of the second film 22 may use a film made from the materials stated above which were cited as examples of the constituent materials of the base material of the first film 21.

A film made of the abovementioned materials cited as examples of the constituent material of the base material of the first film 21 has heat resistant and chemical resistant properties, and therefore is suitable for use in the first and second films 21, 22. In particular, a polyimide film which has excellent heat resistant and chemical resistant properties is suitable for the first and second films 21, 22. A nylon film has inferior heat resistant properties and chemical resistant properties compared to a film made of the other materials described above, but is inexpensive. A nylon film can be applied, for example, in cases where the immersion time in the plating solution is sufficiently short for the chemical solution which has permeated into the first and second films 21, 22 not to reach the adhesive layer. Furthermore, if the thickness of the plating layer formed by the plating process described below, for example, is small and the immersion time in the plating solution is short, then it is possible to use an inexpensive polyethylene terephthalate film for the first and second films 21, 22.

When using a polyethylene terephthalate film for the first and second films 21, 22, it is possible to lengthen the time taken for the chemical solution that has penetrated into the film to reach the adhesive layer by increasing the thickness of the polyethylene terephthalate film, but as described below, this is not desirable as the rigidity of the film becomes higher and bonding to the side surface of the semiconductor wafer 30 becomes more difficult. Therefore, the first and second films 21, 22 desirably have a rigidity which enables deformation in accordance with the shape of the semiconductor wafer 30. Furthermore, in order to form the overlap section 23 in the finish end portion 22d of the second film 22, it is desirable to apply a treatment which makes the adhesive layer of the second film 22 readily adhere tightly, on the surface of the base material of the second film 22.

Next, pre-treatment for the electroless plating process is carried out at a temperature of approximately 80° C., for example, by a generic method. The subsequent steps are described with reference to FIGS. 4 to 7 which illustrate a case of using a normal semiconductor wafer 20. Although not shown in the drawings, even when using a rib-shaped semiconductor wafer 30, the subsequent steps should be carried out similarly to the case of using a normal semiconductor wafer 20. Next, as shown in FIG. 4, a nickel plating layer 11 is stacked on the entire front surface of the semiconductor wafer 20, in other words, the entire surface of the emitter electrode 6, by an electroless plating process, for example, and furthermore a gold plating layer 12 is stacked on the entire surface of the nickel plating layer 11 (step S10).

The nickel plating layer 11 fuses with the solder during solder bonding with the external connection terminal, as described above, but has a large thickness compared to the nickel layer constituting the collector electrode 9. Therefore, the nickel plating layer 11 should be designed so as to leave approximately 2 μm, for example, after solder bonding with the external connection terminal. Consequently, even if the nickel plating layer 11 fuses with the solder during solder bonding with the external connection terminal, the solder does not reach the emitter electrode 6 in the lower layer which is made of aluminum and has low adhesion with the solder. In order to form the nickel plating layer 11 to the prescribed thickness, the processing time for obtaining a prescribed thickness of the nickel plating layer 11 is calculated from the precipitation speed of the nickel plating layer 11, and the like, for example, and the electroless plating process is carried out on the basis of this processing time.

Figure 5:
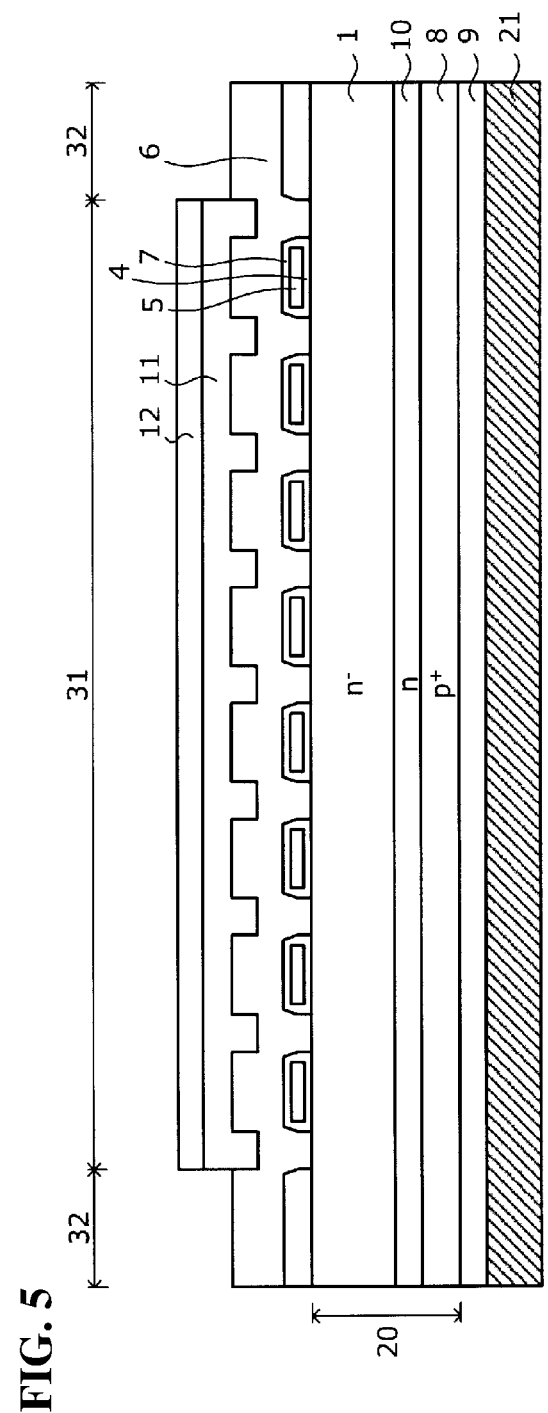
FIG. 5 is a cross-sectional diagram showing a state during the course of the manufacture of a semiconductor device according to the embodiment.

Next, as shown in FIG. 5, the second film (side surface holding film) 22 is separated from the outer peripheral portion 32 of the semiconductor wafer 20 and discarded (step S11). More specifically, for example, similarly to a case where the second film 22 is bonded to the outer peripheral portion 32 of the semiconductor wafer 20, the semiconductor wafer 20 is fixed on top of a stage provided with a vacuum chuck. The second film 22 should be gradually separated and recovered by rotating the stage in reverse rotation to when the second film 22 is bonded, in a state where the projecting section 24 of the finish end portion 22d of the second film 22 is held by film holding means, such as a head roller provided with a suction head, for example. Furthermore, the second film 22 may be separated from the semiconductor wafer 20 by holding the projecting section 24 by film holding means and pulling the projecting section 24. In this case, the stage to which the semiconductor wafer 20 has been fixed may be in a state of halted rotation, or may be in a state of having been rotated in the reverse direction when the second film 22 is bonded.

Figure 6:
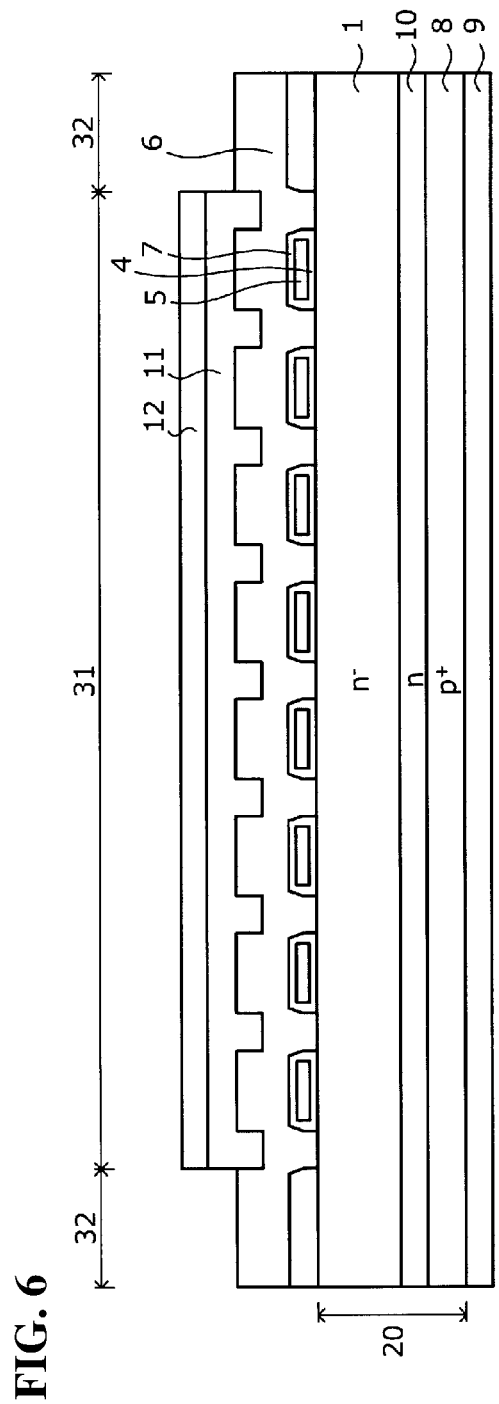
FIG. 6 is a cross-sectional diagram showing a state during the course of the manufacture of a semiconductor device according to the embodiment.
Figure 7:
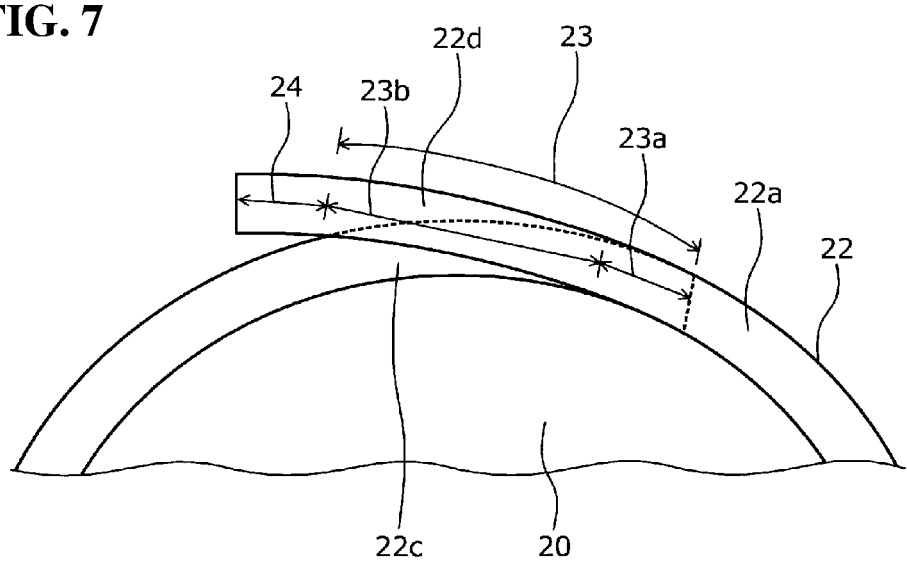
FIG. 7 is a plan diagram showing a state during the course of the manufacture of a semiconductor device according to the embodiment.

Next, as shown in FIG. 6, the first film (rear surface protective film) 21 is separated from the rear surface of the semiconductor wafer 20 and discarded (step S12). More specifically, when a UV film is used as the first film 21, for example, firstly, UV light is irradiated onto the adhesive layer of the first film 21 from the first film 21 side, and the force of adhesion of the adhesive layer is weakened. Thereupon, a further film with an adhesive layer is bonded to the vicinity of the end portion of the first film 21, for example, and by lifting up this film with an adhesive layer, it is possible to readily separate the first film 21 together with the film with an adhesive layer. Thereafter, by cutting (dicing) the semiconductor wafer 20 into chips, the FS-type IGBT shown in FIG. 1 is completed.

The plating process in step S10 described above was explained with reference to a case of using an electroless plating method, but the invention is not limited to this and it is possible to use an electroplating method, for example. Furthermore, the plating layer formed on the surface of the emitter electrode 6 is not limited to a nickel plating layer 11 or a gold plating layer 12, and may be altered variously. For example, the plating layer formed on the surface of the emitter electrode 6 may be a electroplated nickel-phosphorus alloy plating, substitute gold plating, electroless gold plating, electroless nickel-palladium (Pd)-phosphorus alloy plating, electroless nickel-boron (B) alloy plating, electroless nickel-phosphorus PTFE (fluorine resin) composite plating, electroless nickel-boron-graphite (C) composite plating, electroless copper plating, electroless silver (Ag) plating, electroless palladium plating, electroless platinum (Pt) plating, electroless rhodium (Rh) plating, electroless ruthenium (Ru) plating, electroless cobalt (Co) plating, electroless cobalt-nickel alloy plating, electroless cobalt-nickel-phosphorus alloy plating, electroless cobalt-tungsten (W)-phosphorus alloy plating, electroless cobalt-tin (Sn)-phosphorus alloy plating, electroless cobalt-zinc (Zn)-phosphorus alloy plating, electroless cobalt-manganese (Mn)-phosphorus alloy plating, electroless tin plating, or electroless solder plating.

Furthermore, a plating layer may also be provided only on the surface of the gate electrode pad (not illustrated). For instance, when a nickel plating layer and a gold plating layer are formed successively on the surface of the gate electrode pad, similarly to the surface of the emitter electrode 6, it is possible to use a similar method to that of the nickel plating layer 11 and the gold plating layer 12 formed on the surface of the emitter electrode 6. Alternatively, the nickel plating layer and the gold plating layer may be formed successively on the surface of the gate electrode 5, simultaneously with the nickel plating layer 11 and the gold plating layer 12 which are formed on the surface of the emitter electrode 6.

The control of the respective sections of the manufacturing device, such as the stage and/or rollers, which are used in the method for manufacturing a semiconductor device illustrated in the present embodiment can be achieved by implementing a previously prepared program in a computer, such as a personal computer and/or work station, etc. This program is recorded on a computer-readable recording medium, such as a hard disk, flexible disk, CD-ROM, MO, DVD, or the like, and is executed by being read out from a recording medium by a computer.

As described above, according to the embodiment, by pressing the second film against the side surface of the semiconductor wafer by the pressing roller and sandwiching the end portions in the widthwise direction of the second film between the main surfaces of the semiconductor wafer by the sandwiching roller, it is possible to bond the second film to the outer peripheral portion of the semiconductor wafer without giving rise to wrinkles or locations which separate from the semiconductor wafer. Consequently, it is possible to prevent the plating solution that has penetrated into the adhesive layer via the end portions in the widthwise direction of the second film during the plating process from reaching the side surface of the semiconductor wafer. Accordingly, the plating solution is prevented from contacting the portion of the semiconductor wafer where the plating layer is not to be formed. Therefore, it is possible to prevent abnormal precipitation of the plating layer onto the portion where the plating layer is not to be formed, and soiling of the plating bath and/or temporal change in the composition of the bath caused by separation of the abnormally precipitated plating layer, and the like. Consequently, it is possible to prevent the occurrence of variations in the plating layer formed on the front surface side of the semiconductor wafer, as well as being able to form a plating layer stably on the front surface side of the semiconductor wafer.

Furthermore, according to the embodiment, by appropriately controlling the pressing roller and the sandwiching rollers, it is possible to make the end portions in the lengthwise direction of the second film overlap with each other readily, as well as being able to readily form a projecting section that becomes a holding section for separation when separating the second film. By causing the end portions in the lengthwise direction of the second film to overlap with each other, it is possible to prevent the plating solution that has permeated into the adhesive layer via the end portion in the lengthwise direction of the second film from reaching the side surface of the semiconductor wafer. Moreover, it is possible to separate the second film readily by holding the projecting section in the lengthwise direction of the second film, and rotating the semiconductor wafer or pulling the projecting section.

Furthermore, according to the embodiment, by providing a V groove in the side surface of the pressing roller and thereby pressing the second film against the side surface of the semiconductor wafer by the pressing roller, the second film curves and it is possible to make two end portions of the widthwise direction of the second film respectively approach the two main surfaces of the semiconductor wafer. Consequently, when the second film is bonded to the two main surfaces of the semiconductor wafer by the sandwiching roller, it is possible to suppress the occurrence of wrinkles in the second film and the occurrence of locations which partially separate from the semiconductor wafer in the end portions in the widthwise direction of the second film. Furthermore, by providing a V groove in the side surface of the pressing roller, it is possible to suppress the pressing pressure produced by the pressing roller, and the durability of the pressing roller can be improved in comparison with a case where the V groove is not provided.

Furthermore, according to the embodiment, by bonding the second film to the outer peripheral portion of the semiconductor wafer such that the second film spans from the front surface to the rear surface of the semiconductor wafer, it is possible to prevent the formation of a plating layer on the dicing line surface, for example, which is formed in the outer peripheral portion of the semiconductor wafer. Therefore, for example, it is possible to avoid problems that occur due to the formation of a plating layer on the dicing line surface (for example, the front surface electrode potential and the substrate potential becoming the same via the plating layer on the dicing line surface, or the like). Moreover, according to the embodiment, it is possible to carry out a plating process on an inexpensive FZ wafer, without using an expensive resist. Furthermore, it is possible to form a plating layer only on a prescribed location, without using a special jig for preventing the plating solution from flowing around into the portion where the plating layer is not to be formed. Consequently, it is possible to reduce the manufacturing costs of the semiconductor element.

First Example

Next, the relationship between the Shore hardness and the durability of the pressing roller 41 was investigated. FIG. 13 is a characteristics diagram showing a relationship between the Shore hardness and durability of the pressing roller. A plurality of semiconductor devices (called "First Example" below) was formed using pressing rollers 41 having different Shore hardnesses, in accordance with the semiconductor device according to the embodiment described above. In each of the First Examples, a plurality of samples is manufactured using 1000 semiconductor wafers 20 each time. The diameter and product thickness of the semiconductor wafer 20 were 8 inches and 80 µm respectively. The pressing pressure of the pressing roller 41 and the angle θ of the V groove 41a were respectively 150 kPa and 120 degrees. The sandwiching roller 42 was a one-stage roller. In each of the samples in the First Example, the state of the semiconductor wafer 20 and the second film 22 after the plating process (called "state after plating process" below), and the state of the pressing roller 41 were confirmed. FIG. 13 shows the results.

In FIG. 13, in respect of the state after the plating process, a case where separation of the second film 22 and/or abnormal growth is not confirmed after the plating process is taken to be "satisfactory" and is indicated by "○". On the other hand, a case where slight separation of the second film 22 and/or abnormal growth of the plating layer is confirmed after the plating process, although there is no problem with the current quality, is indicated by "Δ". A case where separation of the second film 22 and/or abnormal growth is confirmed after the plating process is taken to be "unsatisfactory" and is indicated by "x". Furthermore, in respect of the durability of the pressing roller 41, a case where no cutting marks occur after processing of 1000 semiconductor wafers 20 is taken to be "satisfactory" and is indicated by "○". On the other hand, a case where a cutting mark occurs in the pressing roller 41 after processing 1000 semiconductor wafers 20 is taken to be "unsatisfactory" and is indicated by "x".

From the results shown in FIG. 13, it was confirmed that the state after the plating process is satisfactory if the Shore hardness of the pressing roller 41 is no less than 30 and no more than 90 (the range enclosed by the thick frame). Furthermore, it was confirmed that if the Shore hardness of the pressing roller 41 is no less than 30 and no more than 90, then both the state after the plating process and the state of the pressing roller 41 are satisfactory. The reason for results of this kind is that, if the Shore hardness of the pressing roller 41 is greater than 90, then the adhesion of the second film 22 is poor, and if the Shore hardness of the pressing roller 41 is small and less than 30, then the pressing roller 41 is worn by friction, and cutting marks occur in the pressing roller 41. Therefore, in order to achieve both close adhesion of the second film 22 and durability of the pressing roller 41, it is important to optimize the Shore hardness of the pressing roller 41.

Second Example

Next, the relationship between the pressing pressure and the durability of the pressing roller 41 was investigated. FIG. 14 is a characteristics diagram showing a relationship between the pressing pressure and durability of the pressing roller. A plurality of semiconductor devices (called "Second Example" below) was formed by variously altering the pressing pressure of the pressing roller 41 when bonding the second film 22, in accordance with the semiconductor device according to the embodiment described above. In each of the Second Examples, a plurality of samples was manufactured using 1000 semiconductor wafers 20 each time. The diameter and product thickness of the semiconductor wafer 20 were similar to the First Example. The Shore hardness of the pressing roller 41 and the angle θ of the V groove 41a were respectively 60 degrees and 120 degrees. The sandwiching roller 42 was a one-stage roller. The state after the plating process and the state of the pressing roller 41 were confirmed in respect of each of the samples in the Second Example. FIG. 14 shows the results. The indications (○, Δ, x) in the investigation results in FIG. 14 are the same as FIG. 13.

From the results shown in FIG. 14, it was confirmed that the state after the plating process is satisfactory when the pressing pressure of the pressing roller 41 is no less than 50 kPa and no more than 300 kPa. Furthermore, was confirmed that, when the pressing pressure of the pressing roller 41 is no less than 50 kPa and no more than 250 kPa, then the state after the plating process and the state of the pressing roller 41 are both satisfactory (the range enclosed by the thick frame). The reason for results of this kind is that, when the pressing pressure of the pressing roller 41 is small, at less than 50 kPa, then the adhesion of the second film 22 is poor, and when the pressing pressure of the pressing roller 41 is greater than 250 kPa, then the durability of the pressing roller 41 becomes worse.

Third Example

Next, the relationship between the angle θ of the V groove 41a of the pressing roller 41 and the durability was investigated. FIG. 15 is a characteristics diagram showing a relationship between the angle of the V groove and the durability of the pressing roller. A plurality of semiconductor devices (called "Third Example" below) was formed using pressing rollers 41 having different angles θ of the V groove 41a, in accordance with the semiconductor device according to the embodiment described above. In each of the Third Examples, a plurality of samples was manufactured using 1000 semiconductor wafers 20 each time. The diameter and product thickness of the semiconductor wafer 20 were similar to the First Example. The Shore hardness and pressing pressure of the pressing roller 41 were respectively 60 and 150 kPa. The sandwiching roller 42 was a one-stage roller. The state after the plating process and the state of the pressing roller 41 were confirmed in respect of each of the samples in the Third Example. FIG. 15 shows the results. Furthermore, FIG. 15 also shows the investigation results (no groove) for a case of using a pressing roller which is not provided with a V groove, for the purposes of comparison (called "comparative example" below). The method of manufacture in the comparative example was the same as the Third Example, apart from the shape of the pressing roller. The indications (◯, Δ, x) in the investigation results in FIG. 15 are the same as FIG. 13.

From the results shown in FIG. 15, it was confirmed that the state after the plating process is satisfactory when the angle θ of the V groove 41a of the pressing roller 41 is no less than 20 degrees and no more then 160 degrees. Furthermore, it was confirmed that, when the angle θ of the V groove 41a of the pressing roller 41 is no less than 30 degrees and no more than 160 degrees, then the state after the plating process and the state of the pressing roller 41 are both satisfactory (the range enclosed by the thick frame). On the other hand, in the comparative example, it was confirmed that the state after the plating process and the state of the pressing roller 41 were both unsatisfactory. In the Third Example, the reason for the results of this kind is that, if the angle θ of the V groove 41a of the pressing roller 41 is greater than 160 degrees, then the adhesion of the second film 22 is poor and the durability of the pressing roller 41 is also poor. Furthermore, when the angle θ of the V groove 41a of the pressing roller 41 is small, at less than 30 degrees, then cutting marks are liable to occur in the pressing roller, and the durability becomes worse.

Fourth Example

Next, the relationship between the sandwiching pressure of the sandwiching roller 42 and the state immediately after bonding the second film 22 was investigated. FIGS. 16 and 17 are characteristic diagrams showing a relationship between the sandwiching pressure of the sandwiching roller and the state immediately after bonding the second film. A plurality of semiconductor devices (called "Example 4-1" below) was formed by disposing one set of (one-stage) sandwiching rollers 42 in accordance with the semiconductor device according to the embodiment described above, and by variously altering the sandwiching pressure of the sandwiching rollers 42 when bonding the second film 22. In each of the Examples 4-1, a plurality of samples was manufactured using 1000 semiconductor wafers 20 each time. The diameter and product thickness of the semiconductor wafer 20 were similar to the First Example. The Shore hardness, pressing pressure, and angle θ of the V groove 41a, of the pressing roller 41 were respectively 60, 150 kPa and 120 degrees.

Furthermore, a plurality of semiconductor devices (called "Example 4-2" below) was formed by disposing two set of (two-stage) sandwiching rollers 42 in accordance with the semiconductor device according to the embodiment described above, and by variously altering the sandwiching pressure of the two sets of sandwiching rollers 42 when bonding the second film 22. In each of the Examples 4-2, a plurality of samples was manufactured using 1000 semiconductor wafers 20 each time. The conditions of the semiconductor wafer 20 and the pressing roller 41 were the same as Example 4-1. The state immediately after bonding the second film 22 was confirmed in respect of each of the samples of the Examples 4-1 and each of the samples of the Examples 4-2. FIGS. 16 and 17 show the respective results.

In FIGS. 16 and 17, in respect of the state immediately after bonding the second film 22, a case where there is a large number of semiconductor wafers 20 in which the force of adhesion of the second film 22 is strong, compared to a case of using a pressing roller that is not provided with a V groove, is considered to be "satisfactory" and is indicated by a "◯". On the other hand, a case where there is a small number of semiconductor wafers 20 in which the force of adhesion of the second film 22 is strong, compared to a case of using a pressing roller which is not provided with a V groove, is indicated with a "Δ". In all of the semiconductor wafers 20, a case where the force of adhesion of the second film 22 is weak is considered to be "unsatisfactory" and is indicated with an "x". A state where the force of adhesion of the second film 22 is strong means a case where locations where wrinkles occur in the second film 22 and/or locations that separate from the surface of the semiconductor wafer 20 do not occur in the end portions 22a, 22b of the widthwise direction of the second film 22.

From the results shown in FIG. 16, it was confirmed that when one set of sandwiching rollers 42 is disposed, if the sandwiching pressure of the sandwiching rollers 42 is no less than 20 kPa and no more than 150 kPa, then the state immediately after bonding of the second film 22 is satisfactory (the range enclosed by the thick frame). Furthermore, from the results shown in FIG. 17, it was confirmed that, when two sets of sandwiching rollers 42 are disposed, if the sandwiching pressure of the first-stage sandwiching rollers 42 is no less than 20 kPa and no more than 200 kPa, and the sandwiching pressure of the second-stage sandwiching rollers 42 is no less than 20 kPa and no more than 400 kPa, then the state immediately after bonding of the second film 22 is satisfactory (the range enclosed by the thick frame). In other words, it was confirmed that the sandwiching pressure can be increased by disposing two sets of sandwiching rollers 42, compared to when one set of sandwiching rollers 42 is disposed.

Although not illustrated in the drawings, it was confirmed by the present inventors that, according to the conditions of the present invention described above, it is possible to separate the second film 22 satisfactorily. Moreover, in the present invention, it is possible to separate the second film 22 easily, by leaving a projecting section 24 in the end portion of the lengthwise direction of the second film 22.

The present invention can be modified variously without departing from the essence of the present invention, and the element structure and/or material of the electrodes and plating layer, and the constituent materials and dimensions, etc. of the wafer main surface forming the plating layer, and the first and second films, are set variously in accordance with the required specifications, etc. For example, in the embodiments described above, a plating layer is formed on the front surface side of the semiconductor wafer in a state where the rear surface and the side surface of the semiconductor wafer are protected by the film, but it is also possible to protect the front surface and the side surface of the semiconductor wafer with a film and to form a plating layer on the rear surface side of the semiconductor wafer. Furthermore, similar results are obtained if a configuration is adopted in which the plating layer is formed on the front surface (or rear surface) side of the semiconductor wafer in a state where the second film has been bonded to the side surface of the semiconductor wafer and the first film has then been bonded to the rear surface (or the front surface) of the semiconductor wafer. In this case also, the method for bonding the first and second films respectively to the front surface (or rear surface) of the semiconductor wafer and the side surface of the semiconductor wafer is similar to that of the embodiment described above.

Moreover, in the embodiment described above, a case was described in which a first film provided previously with an adhesive layer was used, but instead of this, it is also possible to use a first film formed by bonding a film that is to be a base material onto a curable resin that is to be an adhesive layer applied to the rear surface of the semiconductor wafer, and then curing the curable resin. Furthermore, in the embodiment described above, a case was described in which a metal layer of which the main component is aluminum was used as an emitter electrode, but it is also possible to further form a nickel layer on top of the metal layer of which the main component is aluminum, and to form a plating layer on the surface of this nickel layer. Moreover, in the embodiment described above, an FS-type IGBT was used as an example, but the invention is not limited to this and may also be applied to semiconductor devices having various element structures, such as a PT-type IGBT, NPT-type IGBT, MOSFET, FWD, and so on. Furthermore, the present invention is also established similarly even when the conductivity types (n⁻ type, p⁻ type) are reversed.

INDUSTRIAL APPLICABILITY

As indicated above, the method for manufacturing a semiconductor device according to the present invention is useful in a power semiconductor device in which an electrode is provided on at least one main surface of a semiconductor substrate, and a plating layer is provided on top of the electrode provided on the main surface.

BRIEF DESCRIPTION OF REFERENCE NUMERALS 1 n⁻ type drift layer
2 p⁺ type base region
3 n⁺ type emitter region
4 gate insulation film
5 gate electrode
6 emitter electrode
7 interlayer insulation film
8 p⁺ type collector layer
9 collector electrode
10 n-type buffer layer
11 nickel plating layer
12 gold plating layer
20 semiconductor wafer of uniform thickness
20a side section of semiconductor wafer of uniform thickness
21 first film (rear surface protective film)
22 second film (side surface protective film)
22a, 22b end portion in widthwise direction of second film
22c start end portion in lengthwise direction of second film
22d finish end portion in lengthwise direction of second film
23 overlap section of finish end portion in lengthwise direction of second film
23a first portion of finish end portion of second film
23b second portion of finish end portion of second film
24 projecting section of finish end portion of second film
30 rib-shaped semiconductor wafer
30a side section of rib-shaped semiconductor wafer
30b chamfered section of rib-shaped semiconductor wafer
31 central section of semiconductor wafer
32 outer peripheral portion of semiconductor wafer
33a step difference section of rib-shaped semiconductor wafer
33b flat section of rear surface side of rib-shaped semiconductor wafer
41 pressing roller
41a V groove in side surface of pressing roller
42 sandwiching roller
42a, 42b pair of rollers constituting sandwiching roller
x width of portion covered by second film
θ angle of V groove in side surface of pressing roller

What is claimed is:

1. A method for manufacturing a semiconductor device, comprising:

a first step of forming a first electrode on one main surface side of a semiconductor wafer;

a second step of bonding a first film to another main surface side of the semiconductor wafer at a side opposite to the one main surface;

a third step of bonding, after the second step, a second film to an outer peripheral portion of the semiconductor wafer by applying pressure to the second film on the semiconductor wafer using a plurality of cylindrical rollers; and a fourth step of forming, after the third step, a plating layer on the first electrode on the one main surface side of the semiconductor wafer by a plating process;

wherein a first roller contacting a side surface of the semiconductor wafer through the second film, and second rollers contacting one main surface and another main surface of the semiconductor wafer respectively through the second film, are used as the plurality of rollers;

wherein the third step includes: a first bonding step of pressing and bonding the second film to the side surface of the semiconductor wafer with the first roller; and a second bonding step of bonding an end portion of the second film to the main surface of the semiconductor wafer by sandwiching the end portion between the second roller and the semiconductor wafer in a state in which the second film is bonded to the side surface of the semiconductor wafer; and wherein in the second bonding step, the end portion of the second film is sandwiched between the second roller and the semiconductor wafer from a portion of the second film bonded to the side surface of the semiconductor wafer by the first roller.

2. The method for manufacturing a semiconductor device according to claim 1, wherein in the third step, the second film is bonded at least one lap around the outer periphery of the semiconductor wafer.

3. The method for manufacturing a semiconductor device according to claim 2, wherein in the third step, the second film is bonded so that a finish end portion of the second film on a bonding finish point side in a direction along the outer periphery of the semiconductor wafer overlaps with a start end portion of the second film on a bonding start point side in the direction along the outer periphery of the semiconductor wafer.

4. The method for manufacturing a semiconductor device according to claim 3, wherein in the third step, a free end side of the finish end portion of the second film on the bonding finish point side in the direction along the outer periphery of the semiconductor wafer projects outward beyond the side surface of the semiconductor wafer to form a projecting section.

5. The method for manufacturing a semiconductor device according to claim 4, further comprising a fifth step of, after the fourth step, holding the projecting section of the second film to separate the second film.

6. The method for manufacturing a semiconductor device according to claim 1, wherein the first roller is made of an elastic body, and
a Shore hardness of the first roller is no less than 30 and no more than 90.

7. The method for manufacturing a semiconductor device according to claim 1, wherein a pressure applied to the semiconductor wafer by the first roller when bonding the second film is no less than 50 kPa and no more than 250 kPa.

8. The method for manufacturing a semiconductor device according to claim 1, wherein the first roller has a V-shaped groove in a portion facing the side surface of the semiconductor wafer.

9. The method for manufacturing a semiconductor device according to claim 8, wherein an angle of the groove in the first roller is no less than 30 degrees and no more than 160 degrees.

10. The method for manufacturing a semiconductor device according to claim 1, wherein in the third step, the second film is bonded to the outer peripheral portion of the semiconductor wafer so that the second film spans from the one main surface to the another main surface of the semiconductor wafer.

11. The method for manufacturing a semiconductor device according to claim 1, wherein in the third step, the second film is bonded to the outer peripheral portion of the semiconductor wafer so that the second film ends on the first film.

12. The method for manufacturing a semiconductor device according to claim 1, wherein the fourth step comprises forming a plurality of plating layers successively on the first electrode.

13. The method for manufacturing a semiconductor device according to claim 1, wherein the fourth step includes at least a step of forming a nickel layer on the first electrode by an electroless plating process, or a step of forming a nickel layer on the first electrode by an electroplating process.

14. The method for manufacturing a semiconductor device according to claim 1, wherein the first step comprises forming the first electrode on the main surface side of the semiconductor device and a second electrode on the another main surface side of the semiconductor wafer, and
in the second step, the first film is bonded on the another main surface side of the semiconductor wafer to cover the second electrode.

* * * * *

UNITED STATES PATENT AND TRADEMARK OFFICE
CERTIFICATE OF CORRECTION

PATENT NO. : 9,466,584 B2
APPLICATION NO. : 14/990355
DATED : October 11, 2016
INVENTOR(S) : Shoji Sakaguchi Page 1 of 1

It is certified that error appears in the above-identified patent and that said Letters Patent is hereby corrected as shown below:

In the specification

Please change column 22, line 66, from "... Furthermore, was ..." to --... Furthermore, it was ...--.

Signed and Sealed this
Twentieth Day of December, 2016

Michelle K. Lee
*Director of the United States Patent and Trademark Office*